(12) United States Patent
Nestler et al.

(10) Patent No.: US 9,312,831 B2
(45) Date of Patent: Apr. 12, 2016

(54) CHARGE SHARING ANALOG COMPUTATION CIRCUITRY AND APPLICATIONS

(71) Applicant: Analog Devices, Inc., Norwood, MA (US)

(72) Inventors: Eric Nestler, Concord, MA (US); Vladimir Zlatkovic, Belmont, MA (US); Jeffrey Venuti, Bedford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/043,009

(22) Filed: Oct. 1, 2013

(65) Prior Publication Data

US 2014/0233773 A1   Aug. 21, 2014

Related U.S. Application Data

(63) Continuation of application No. 13/813,101, filed as application No. PCT/US2011/048278 on Aug. 18, 2011, now Pat. No. 8,547,272, and a continuation-in-part of application No. PCT/US2001/041625, filed on Jun. 23, 2011.

(Continued)

(51) Int. Cl.
  *H03B 1/00* (2006.01)
  *H03K 5/00* (2006.01)
  (Continued)

(52) U.S. Cl.
  CPC ......... *H03H 7/0138* (2013.01); *G06F 17/5063* (2013.01); *G10K 15/00* (2013.01);
  (Continued)

(58) Field of Classification Search
  CPC .... H03H 7/0138; H03H 15/02; G06F 1/5063; H02M 1/14; G10K 15/00; H04R 25/00; H03M 1/12
  USPC ........... 327/553, 552; 381/312; 341/172, 155, 341/156; 708/819, 3
  See application file for complete search history.

(56) References Cited

U.S. PATENT DOCUMENTS 4,077,035 A   2/1978   Yee
4,120,035 A * 10/1978   Cases et al. ........................ 708/3

(Continued)

FOREIGN PATENT DOCUMENTS

DE   10 2006 015765   10/2007
EP        0933870    8/1999
EP      1 018 806    7/2000

OTHER PUBLICATIONS

Notice of Allowance in U.S. Appl. No. 13/813,101 mailed Jun. 25, 2013, 9 pages.

(Continued)

*Primary Examiner* — Jean B Jeanglaude
(74) *Attorney, Agent, or Firm* — Patent Capital Group

(57) ABSTRACT

In one aspect, reduced power consumption and/or circuit area of a discrete time analog signal processing module is achieved in an approach that makes use of entirely, or largely, passive charge sharing circuitry, which may include configurable (e.g., after fabrication, at runtime) multiplicative scaling stages that do not require active devices in the signal path. In some examples, multiplicative coefficients are represented digitally, and are transformed to configure the reconfigurable circuitry to achieve a linear relationship between a desired coefficient and a degree of charge transfer. In some examples, multiple successive charge sharing phases are used to achieve a desired multiplicative effect that provides a large dynamic range of coefficients without requiring a commensurate range of sizes of capacitive elements. The scaling circuits can be combined to form configurable time domain or frequency domain filters.

20 Claims, 26 Drawing Sheets

Related U.S. Application Data

(60) Provisional application No. 61/374,915, filed on Aug. 18, 2010, provisional application No. 61/374,954, filed on Aug. 18, 2010, provisional application No. 61/374,931, filed on Aug. 18, 2010, provisional application No. 61/374,937, filed on Aug. 18, 2010, provisional application No. 61/374,904, filed on Aug. 18, 2010, provisional application No. 61/374,946, filed on Aug. 18, 2010, provisional application No. 61/429,922, filed on Jan. 5, 2011, provisional application No. 61/493,893, filed on Jun. 6, 2011.

(51) Int. Cl.
| | |
|---|---|
| *H04B 1/10* | (2006.01) |
| *H03H 7/01* | (2006.01) |
| *H03H 15/02* | (2006.01) |
| *H03H 15/00* | (2006.01) |
| *H03M 1/12* | (2006.01) |
| *G06F 17/50* | (2006.01) |
| *G10K 15/00* | (2006.01) |
| *H02M 1/14* | (2006.01) |
| *H04R 25/00* | (2006.01) |

(52) U.S. Cl.
CPC ............... *H02M 1/14* (2013.01); *H03H 15/00* (2013.01); *H03H 15/02* (2013.01); *H03M 1/12* (2013.01); *H04R 25/00* (2013.01)

(56) References Cited

U.S. PATENT DOCUMENTS

| | | | |
|---|---|---|---|
| 4,399,426 A | 8/1983 | Tan | |
| 4,551,686 A | 11/1985 | Benzinger | |
| 5,235,335 A | 8/1993 | Hester | |
| 5,369,407 A | 11/1994 | Yung et al. | |
| 5,581,252 A | 12/1996 | Thomas | |
| 5,684,478 A | 11/1997 | Panaoussis | |
| 6,054,945 A | 4/2000 | Doyle | |
| 6,414,541 B1 | 7/2002 | Arvidsson | |
| 6,859,762 B2 | 2/2005 | Mawet et al. | |
| 7,199,740 B1 | 4/2007 | Ferguson, Jr. | |
| 7,405,681 B2 | 7/2008 | Jonsson et al. | |
| 7,539,721 B2 | 5/2009 | Belveze et al. | |
| 7,791,407 B2 | 9/2010 | Muhammad et al. | |
| 7,804,434 B2 | 9/2010 | Stoutjesdijk | |
| 7,941,475 B2 * | 5/2011 | Bagheri et al. | 708/819 |
| 7,965,135 B2 | 6/2011 | Yoshizawa et al. | |
| 8,067,972 B2 | 11/2011 | Iida et al. | |
| 2003/0018452 A1 | 1/2003 | Mawet | |
| 2003/0050027 A1 | 3/2003 | Muhammad | |
| 2006/0269312 A1 | 11/2006 | Muraishi | |
| 2008/0048781 A1 | 2/2008 | Wagner | |
| 2008/0057900 A1 | 3/2008 | Fang et al. | |
| 2008/0129573 A1 | 6/2008 | Mueck et al. | |
| 2009/0002066 A1 | 1/2009 | Lee | |
| 2009/0322580 A1 | 12/2009 | Belveze et al. | |
| 2010/0198898 A1 | 8/2010 | Pan | |
| 2010/0223225 A1 | 9/2010 | Vigoda et al. | |
| 2010/0225419 A1 | 9/2010 | Pan | |

OTHER PUBLICATIONS

English Translation of Proposed Claims in Chinese Office Action for Chinese Patent Application Serial No. 201180045990.5 mailed Dec. 31, 2014, 6 pages.

D'Mello, Design Approaches to Field-Programmable Analog Integrated Circuits, Analog Integrated Circuits and Signal Processing, 1998.

Martinez, Discrete Time Filters, Wiley 1999.

Rivet, A 65nm CMOS RF Front End Dedicated to Software Radio in Mobile Terminals, Proc. SDR 2008.

Lacy, Cameron B., "Design of a Programmable Switched-Capacitor Analog FIR Filer," [online: retrieved Nov. 14, 2012 https://tspace.library.utoronto.ca/bitstream/1807/14967/1/MQ46200.pdf] XP55044242 (1999).

Response to 1st Chinese Office Action issued in CN Application Serial No. 201180045990.5 filed May 8, 2015, 7 pages.

English Translation of Amended Claims in Response to 1st Chinese Office Action issued in CN Application Serial No. 201180045990.5 filed May 8, 2015, 4 pages.

Chinese Office Action issued in CN Application Serial No. 201180045990.5 mailed Aug. 5, 2015, 3 pages.

Response to Chinese Office Action issued in CN Application Serial No. 201180045990.5 filed Oct. 22, 2015, 4 pages.

* cited by examiner

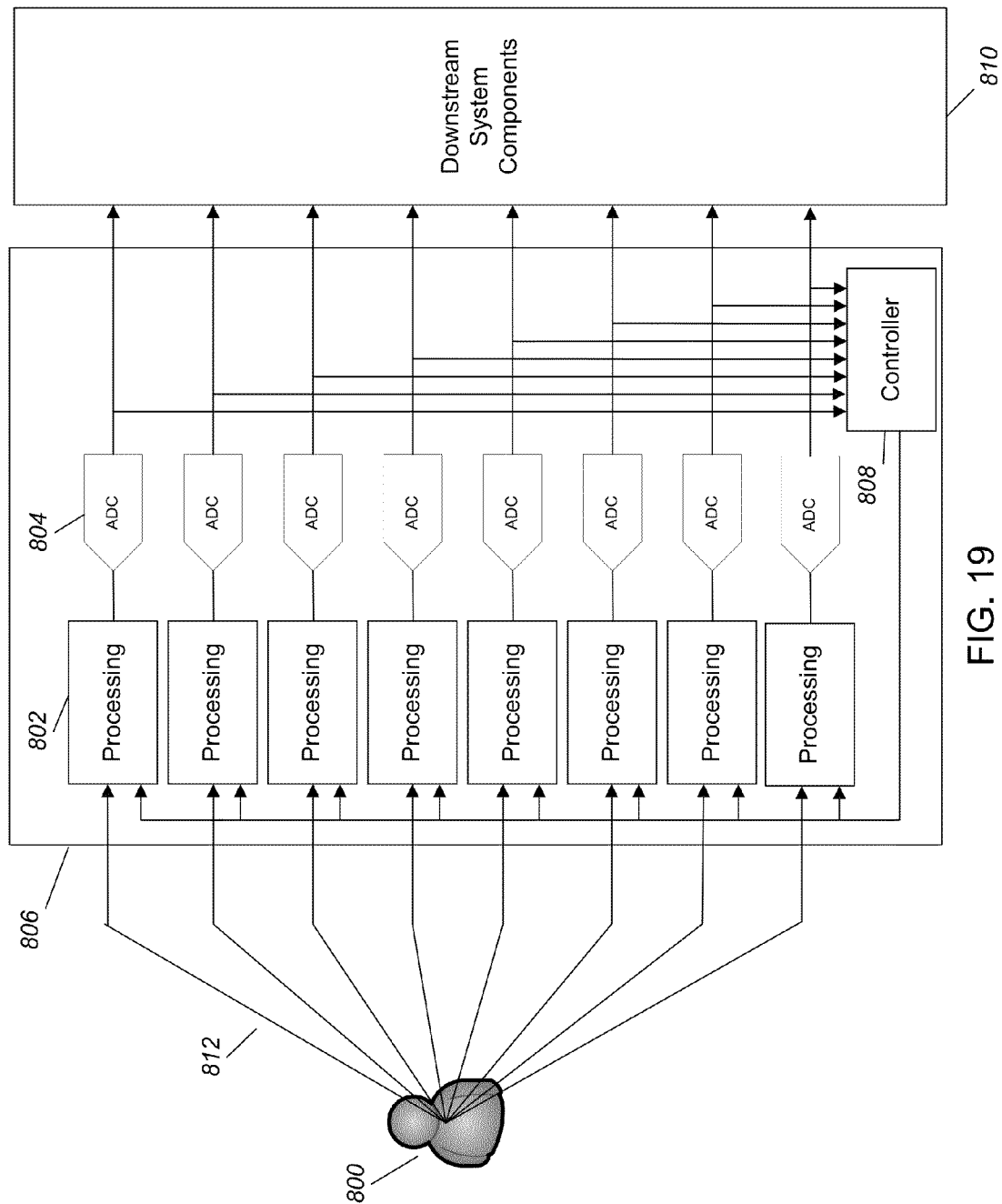

CHARGE SHARING ANALOG COMPUTATION CIRCUITRY AND APPLICATIONS

CROSS-REFERENCE TO RELATED APPLICATIONS

This application is a continuation of U.S. application Ser. No. 13/813,101, which issued as U.S. Pat. No. 8,547,272 on Oct. 1, 2013, and which is the national phase of International Application No. PCT/US2011/048278, filed Aug. 18, 2011, which claims the benefit of U.S. Provisional Application No. 61/374,915, filed Aug. 18, 2010. Each of these applications are incorporated herein by reference.

This application also claims the benefit of the following applications, each of which is also incorporated by reference:

U.S. Ser. No. 61/493,893, filed Jun. 6, 2011, titled "CHARGE SHARING IIR FILTER";

U.S. Ser. No. 61/374,946, filed Aug. 18, 2010, titled "ULTRASOUND IMAGING WITH PROBE-BASED ANALOG PROCESSING";

International Serial No. PCT/US11/41625, filed Jun. 23, 2011, titled "ULTRASOUND IMAGING WITH ANALOG PROCESSING";

U.S. Ser. No. 61/374,904, filed Aug. 18, 2010, titled "HEARING AID SYSTEMS WITH ANALOG PROCESSING.";

U.S. Ser. No. 61/374,937, filed Aug. 18, 2010, titled "SYSTEM LINEARIZATION WITH ANALOG PROCESSING";

U.S. Ser. No. 61/429,922, filed Jan. 5, 2011, titled "SYSTEM LINEARIZATION WITH ANALOG PROCESSING";

U.S. Ser. No. 61/374,954, filed Aug. 18, 2010, titled "SIGNAL ACQUISITION SYSTEM"; and Ser. No. 61/374,931, filed Aug. 18, 2010, titled "ANALOG FOURIER TRANSFORM DEVICE."

STATEMENT AS TO FEDERALLY SPONSORED RESEARCH

This invention was made with government support under FA8750-07-C-0231 awarded by the Defense Advanced Research Projects Agency (DARPA). The government has certain rights in the invention.

This application is related to the following U.S. Application, which is incorporated by reference without claiming the benefit of its filing date:

U.S. Pat. Pub 2010/0207644A1, titled "Analog Computation," published on Aug. 19, 2010.

BACKGROUND

This invention relates to analog computation, and in particular relates to circuitry for analog computation that includes charge sharing components.

Discrete time, or more generally discrete sample (e.g., spatial sample), signal processing has been implemented using analog signals. For example, a wide range of what are often referred to as "switched capacitor" filters are used, generally making us of a technique of charge transfer using active amplifier stages, whereby a signal represented by charge on capacitive elements at an input of an amplifier stage is transferred to charge on capacitive elements at an output of the amplifier stage. An advantage of circuitry that directly processes analog signals is avoiding the need to convert the signal levels to digital form and reduced circuit resources required to process the signal levels in analog form and/or higher clocking rates, as compared to use of a digital arithmetic unit of digital signal processor.

Discrete time processing of analog signals, for instance discrete time signal processing or computation of signal transforms, may require scaling of signal values according to configurable scale factors, which may be provided in digital form. One approach to implementing such scale factors makes use of multiplying digital to analog converters.

However, such an approach may have limitations based on factors such as power consumption and circuit area.

Another approach to discrete time analog signal processing makes use of active elements for combining analog signals. For example, one approach to implementing a finite impulse response filter is to use a capacitor array (e.g., a tapped delay line) to store signal values, and a set of analog multipliers with controllable gain that scale the voltages at the outputs of the array prior to combination to determine the output of the filter.

SUMMARY

In general, there is a need to reduce power consumption and/or circuit area for discrete time analog signal processing modules. One approach is to make use of entirely, or largely, passive charge sharing circuitry, which may include configurable (e.g., after fabrication, at runtime) multiplicative scaling stages that do not require active devices in the signal path.

In some aspects, in general, an analog computation circuit includes charge sharing components, including one or more reconfigurable multiplicative charge sharing components. In some examples, multiplicative coefficients are represented digitally, and are transformed to configure the reconfigurable circuitry to achieve a linear relationship between a desired coefficient and a degree of charge transfer. For instance, a lookup table accepts a coefficient representation and provides outputs that configure a circuit that include multiple separate capacitive elements. In some examples, area of capacitive elements is saved over approaches that use conventional linear Capacitive Digital to Analog Converter (capacitive DAC, CapDAC) implementations by approximating higher resolution capacitor arrays with non-linear combination of smaller capacitor arrays. In some examples, multiple successive charge sharing phases are used to achieve a desired multiplicative effect that provides a large dynamic range of coefficients without requiring a commensurate range of sizes of capacitive elements.

In another aspect, in general, a signal processing device includes a signal scaling circuit for accepting an analog input signal value and a digital scaling control value representing a scaling factor and storing an analog representation of a scaled signal value determined from (e.g., as a product of) the accepted signal value and the scaling factor in an output stage for the scaling circuit.

Aspects can include one or more of the following features.

The passive signal scaling circuit comprises a plurality of switchably interconnected capacitive elements, and wherein in operation of the scaling circuit, the scaled signal value is formed in a succession phases.

Each phase is associated with a configuration of the switchable interconnection of capacitive elements.

Each configurable interconnection of the capacitive elements permitting charge sharing among interconnected capacitors.

At least one of the capacitive elements is configured according to the digital scaling control value.

The passive signal scaling circuit is controllable to operate in at least two modes, each mode being associated with a different succession of configurations of the switchable interconnections between capacitive elements.

The mode is specified in the digital scaling control value.

The signal scaling circuit forms a passive circuit.

The passive scaling circuit comprises a capacitive storage element for storing the analog representation of the scaled signal value as a charge value.

The passive scaling circuit comprises an input for accepting the analog input signal value represented as a voltage value.

The passive scaling circuit comprises an input for accepting the analog input signal value represented as charge value on a capacitive storage element.

The signal processing device further includes a passive combination circuit for combining the stored scaled signal values for a plurality of input signal values to form an analog output signal value.

The signal processing device includes multiple passive signal scaling circuits for concurrent scaling of the plurality of input signals values.

The combination of the multiple of passive scaling circuits and the passive combination circuit form signal paths from the input signal values to the output signal value without active gain components.

The passive combination circuit comprises a circuit to determine at least one of a Discrete Fourier Transform (DFT) and an Inverse Discrete Fourier Transform (IDFT) of the plurality of scaled input values.

The passive combination circuit comprises a circuit to determine a Finite Impulse Response (FIR) filter of a time series represented by the plurality of input signal values.

The signal scaling circuit is at least partially integrated into an Analog to Digital Converter (ADC). For instance, the signal scaling circuit includes an input for a reference signal of the ADC and provides an output for comparison with a conversion input of the ADC. In another instance, at least one capacitive element of the signal scaling circuit forms part of a charge transfer based analog to digital conversion circuit.

The plurality of switchably interconnected capacitive elements comprises at least two configurable capacitive elements configurable according to the control input, and switchable to form a parallel combination of capacitances in at least one phase of the succession of phases.

The signal processing device further includes a control value mapping circuit for accepting an input control value and producing the digital control value for configuring the at least one of the capacitive elements.

The control value mapping circuit implements a mapping table for accepting a digital input control value and outputting the digital control value for configuring the capacitive elements.

The control value mapping circuit provides a non-linear mapping between the input control value and digital control value for configuring the capacitive elements such that the scaling factor is substantially a linear function of the input control value.

In another aspect, in general, a configurable passive discrete time analog filter includes: an input for accepting a series in signal input values; a plurality of analog storage elements configurable to store each input value in the series of input value in corresponding plurality of the storage elements; a plurality of passive signal scaling circuits, each configurable to accept an analog input signal value from one of the storage elements and store an analog representation of a scaled signal value equal to a product of the accepted signal value and a digital scaling control value representing a scaling factor scaling factor in an output stage for the scaling circuit; and a passive combination circuit for combining the stored scaled signal values for a plurality of input signal values to form an analog output signal value.

In another aspect, in general, software stored on a computer-readable medium comprising instructions for causing a processor to: accept a plurality of desired filter coefficient values; determining a plurality digital configuration values for a plurality of configurable capacitors in a programmable discrete time analog filter according to a non-linear mapping of the desired filter coefficient values; and providing the digital configuration values for configuration of the programmable filter.

One or more aspect can have the following advantages.

Use of charge sharing approaches, as distinct from charge transfer approaches, enables fully passive implementations or substantially passive implementations with limited numbers of gain stages interconnecting passive blocks. The implementations are passive in the sense that there are no components that provide a power gain of the signal being processed, for instance, using transistor switches to allow charges on capacitors to be shared and thereby equalizing the voltage on the capacitors coupled by the switches.

Analog signal processing using charge redistribution techniques provides a power efficient approach to implementing signal processing components, for example, finite or infinite impulse response filters, Discrete Fourier Transform, and matrix computation components. Providing configurable capacitances in such a circuit, for example, to implement scaling factors in the computation, can be improved by using multiple stages of charge sharing to implement the scaling. The improvement may include reduction in capacitor size, which can reduce the overall circuit size and/or power consumption, and can include reducing the range of capacitor sizes, which for a particular overall circuit size may provide improved performance characteristics, such as improved signal-to-noise characteristics. The improvement can also include being able to provide a greater range of scaling factors and/or greater precision of achievable scale factors than possible with prior circuit arrangements. The use of multiple modes can provide greater precision over the entire operable range, for example, with some modes being preferable in different ranges.

In another aspect, in general, an approach to signal processing in a data acquisition system makes use of analog signal processing prior to conversion to digital signals. For instance, biological signals (e.g., ECG signals) are acquired in analog form and processed in a discrete time analog circuit.

The processing of sensor signals in an ECG system may include any combination of discrete time analog filtering including: low-pass filtering, high-pass filtering, band-pass filtering, notch filtering, and anti-alias filtering. The processing may also include discrete time analog sample rate conversion.

The discrete time analog filters may have configurable parameters. For example, the cutoff frequency of a high-pass filter may be adjusted to adapt to a perturbation in the low frequency noise component caused by the movement of a patient. In another example, the notch filter could be automatically adjusted to null out any unwanted interference. The configuration of the parameters of the discrete time analog filters may be performed by analog circuitry or by a controlling processor such as a microcontroller or general purpose computer.

The processing of the ECG signal may include one or more gain stages. The gain stages can be disposed at any point before, after, or between the discrete time analog filters. The gain stages may be configurable. For example, the gain may be adjusted ensure that the processed signal fully utilizes the input voltage range of the ADC.

The ADC and the discrete time analog filter may be designed together. For example, the output capacitor or capacitors of the analog filter could be shared with the ADC (e.g., a successive approximation ADC). By using redundant capacitors with destructive reads, the need for active components could be eliminated. Additionally, designing the ADC and the discrete time analog filter together allows for optimization of the ADC for digitizing low level signals (e.g., ECG signals).

In some implementations, the processing could be extended to implement matrix operations on a set of ECG leads (i.e., inputs). For example, the potential differences between multiple leads and a reference lead could be compared. In other examples, three-dimensional vector dipole calculations may be performed prior to digitization. In some examples in which a large number of leads are used (e.g., in some fetal ECG applications), analog processing may include reduction of the number of signals, such as selection or preferential weightings to select the quietest set of leads.

In another aspect, in general, a configurable passive discrete time analog filter includes an input for accepting a series of signal input values, an output for outputting a series of signal output values, a number of analog input storage elements configurable to store each input value in the series of input values in a corresponding storage element of the number of the analog input storage elements, a number of analog output storage elements configurable to store each output value in the series of output values in a corresponding storage element of the number of analog output storage elements, a number of passive signal scaling circuits, each configurable to accept an analog input signal value from one of the storage elements of either the number of analog input storage elements or the number of analog output storage elements and store an analog representation of a scaled signal value equal to a product of the accepted signal value and a digital scaling control value representing a scaling factor in an output stage for the scaling circuit, and a passive combination circuit for combining the stored scaled signal values for a number of input signal values with the stored scaled signal values for a number of output signal values to form an analog output signal value.

In another aspect, in general, an approach to signal processing in a hearing aid system makes use of analog signal processing. For instance, the input to a hearing aid system is acquired in analog form and processed in a discrete time analog circuit.

In another aspect, in general, a hearing aid makes use of an adaptive, time-varying and/or configurable filter in the signal path from the microphone to in-ear transducer without requiring digitization of the signal.

In another aspect, a transform analysis of the signal, either before or after filtering in the forward signal path is performed without digitization, for instance, for the purpose of adapting the forward path filter or for adapting a feedback path filter.

The frequency domain and gain characteristics associated with hearing aid systems are generally different for each particular hearing aid user. Additionally, the desired hearing aid system characteristics for a particular user may change based on the sound profile of the environment surrounding the user (e.g., a library vs. a subway station).

One method of addressing the need for different hearing aid characteristics is to use an analog signal processing technique such as discrete time analog filtering. For example, a discrete time analog FIR filter can be implemented with configurable parameters making it easily configurable (and reconfigurable) by a digital system such as a microcontroller.

Another method of addressing the need for different hearing aid characteristics is to use analog frequency domain filtering. For example, an analog Discrete Fourier Transform (DFT) of an input signal could be calculated and a filter can be applied to the spectrum to implement a frequency domain filter. In this way, more advanced filtering options could be used (e.g., zero phase filtering). Additionally, for higher order filters, a frequency domain filter may be more efficient than the equivalent time domain filter. The analog frequency domain filter may include configurable parameters making it easily configurable (and reconfigurable) by a digital system such as a microcontroller.

Another operation that can be accomplished using analog computation techniques is automatic gain control. Automatic gain control can be used to ensure that the dynamic range of signal being presented to the user is appropriate (e.g., it is between the perception and pain thresholds). Gain control may include, for example, automatic frequency dependent attenuation or it may be based on heuristics (e.g., walking into a noisy room causes the gain to quickly change).

The delay between the input and the output of the hearing aid may be reduced by implementing the analog filtering in a path that is separate from the filtering coefficient update calculation path. For example, an unwanted frequency component may be quickly attenuated before the user has a chance to notice it.

Analog processing could also be used to calculate an analog DFT of a signal before the signal is digitized using an analog to digital converter (ADC). By calculating the spectrum of the signal in the analog domain, the need for an expensive and power consuming DSP component may be eliminated and a cheaper, lower power microprocessor can be used.

In another example, analog signal processing techniques could be applied to multiple input systems such as binaural hearing aids. For example, applications such as beam forming, adaptive nulling, and noise cancellation could be implemented.

Analog signal processing techniques could also be used to remove energy that is outside the threshold of hearing from the input signal, thereby reducing the amount of power used by the hearing aid system.

In another aspect, in general, an approach to signal processing in an imaging system makes use of analog signal processing prior to conversion to digital signals. For instance, the outputs of ultrasound signals are acquired in analog form and processed in a discrete time analog circuit.

The processing may include beam forming, matched filtering, and compressive sensing. Beam forming can include introducing delays that are non-integral multiples of the clocking period of the discrete time processing. The processing may be performed in the time domain, the frequency domain (e.g., using analog implemented DFT processing) or both. In some examples, the analog processing may include probabilistic computation, for instance, based on model based or Bayesian approaches.

The analog processing may all be performed in a probe, and optionally digitized before being transmitted using a wired or wireless link to a main section of the system. The digital processing may be controlled by software stored in a computer-readable for controlling a processor, such as a digital signal processor or general purpose computer.

The processing at the main section of the system may include optimization-based reconstruction of an image, and output of signals suitable to driving an image presentation to a user of the system.

In some examples, the processing in the main section provides control and/or feedback signals to configure or control the analog processing in the probe. For instance, the feedback may provide updated projection matrices for compressive sensing applications, gain control, and beam forming pattern. This feedback may be based, for example, on predicted characteristics of the sensed signals, which may be based on estimates of motion of the probe or body being sensed.

In an aspect in general, an integrated device includes a sensor and analysis circuitry having an input for accepting analog time samples of a sensor signal from the sensor, and passive processing circuitry for performing a signal analysis including a configurable interconnections of capacitive elements.

In an aspect, in general, system includes an input for accepting an analog representation of one or more input signals in a set of input signals, one or more configurable passive discrete time analog filters coupled to the input for processing the set of input signals in a discrete time analog representation to produce a set of processed signals, and an output for providing the output signals.

Aspects may include one or more of the following features.

The output signals may include analog representations of the processed signals. The system may include conversion circuitry for accepting the set of processed signals in analog form and converting the processed signals to digitized output signals wherein the output signals include digital representations of the processed signals. A sensor may be coupled to the input.

In one aspect, in general, an approach to linearization of a system, for instance a power amplifier or a motor, makes use of analog signal processing to linearize amplifier behavior.

Nonlinearities associated with power amplifiers generally result in harmonically distorted output signals. The nonlinearities can be corrected by detecting the harmonic distortion in the output signals and adjusting parameters of the input signal to the system or the system itself to reduce or eliminate the harmonic distortion.

One method of power amplifier linearization may include performing an analog Discrete Fourier Transform (DFT) on the output signals of a system. The results of the DFT calculations are used to determine the degree of distortion imparted by the power amplifier.

Providing a power amplifier with one or more adjustable parameters, the method employs an adaptive algorithm such as a gradient scheme to reduce the amount of distortion at the output of the amplifier. The gradient scheme could be, for example, gradient estimation or partial derivative estimation. In these schemes, the gradient of the error is estimated and the adjustable parameters of the power amplifier are adjusted to reduce the amount of estimated error.

The adjustable parameters of the amplifier could include, for example, a plurality of selectable gain stages. The parameter adjustment could include selecting certain gain stages and bypassing other gain stages based on the adaptive parameter adjustment algorithm. In a simple case, the gain in the IF and RF stages could be adjusted independently.

Another method for linearizing a power amplifier involves correcting invertible nonlinearities by pre-distorting the input to the power amplifier. One approach for determining a desired pre-distortion involves taking an analog DFT of the output signals of the power amplifier in the case that the spectrum of the input signal is known or has known characteristics, such as that the input is periodic or has a narrow bandwidth such as in the case of a modulated carrier. Another approach uses results of two DFTs, one on the input signal and one on the output signal, which are then used together to determine the distortion imparted to the output signal by the power amplifier. An algorithm such as a gradient scheme is used to adaptively reduce the distortion by adjusting coefficients (e.g., of a polynomial) pre-distorter. The pre-distortion is applied to the input signal before providing the input signal to the amplifier. The net result of amplifying the pre-distorted signal using the power amplifier is a linear output signal.

While a typical application of linearization of nonlinear systems is power amplifiers, the above described methods are not limited to power amplifiers. Other nonlinear systems such as motors, for example, could benefit from the above methods. When providing a steady drive signal to a motor, it is expected that an even velocity will result. However, it is possible for periodic problems to arise, causing unwanted motor vibration. The methods above can be used to identify periodic problems and adjust parameters to compensate for it.

In applications such as motor linearization, sensors of physical quantities and analog analysis circuitry can be combined into one integrated package. For example, an integrated circuit including an accelerometer and an analog DFT can be disposed on a motor enclosure for the purpose of sensing vibration. The integrated circuit provides output, for example, represent the measured fundamental frequency, the fundamental level, and the level of the measured harmonics.

In another example, an integrated circuit including a current sensor and analog analysis could be configured to sense the current driving a motor. Characteristics of the measured current such as the spectrum could be tracked and some action could be taken when the measured characteristics diverge from the expected characteristics. For instance, a alert could be issued or analog logic could be used to implement an automatic control system to modify the driving signal. Another application is in failure detection, for example, in which a change in spectral characteristics measured in the device is used to signal possible failures.

Any type of sensor could be used (e.g., voltage, current, etc.) and any type of analysis could be performed (e.g., DFT, wavelet, etc.). Additionally, multiple sensors and multiple types of analysis could be included in the same integrated circuit.

In another aspect, in general, an approach frequency domain filtering makes use of analog signal processing to perform a Fourier transform of an input signal, apply a window to the transformed input signal, and perform an inverse Fourier transform to the windowed transformed input signal, yielding a filtered version of the input signal.

In another aspect, in general, an approach to Analog-to-Digital Conversion makes use of charge sharing analog computation by integrating a capacitor (e.g., at the output of a charge sharing analog filter) into the front end of an Analog-to-Digital Converter. In some instances the capacitor can provide analog value storage during operation of a successive approximation converter.

In another aspect, in general, a configurable charge-sharing based filter (e.g., time domain or frequency domain) is integrated into a package (e.g., an integrated circuit or a multi-chip package) with one or more analog inputs and one or more processed analog outputs. The characteristics of the filter at settable, for example, by storing configuration parameters (which can set capacitor values, sequences of charge sharing modes etc.) that control the characteristics of the filter, or by accepting such parameters over a control bus after the device is powered up. In some implementations, a sensor (e.g., microphone, accelerometer, etc.) is integrated into the package and provides one or more of the analog signals that are processed without necessarily having any other analog inputs. In some implementations, an analog-to-digital converter is integrated into the package for digitizing analog signals that are processed in the package, without necessarily providing other analog outputs. Such a package can be provided as a general purpose "universal filter" that can be used in a wide range of applications (e.g., audio processing, medical signal processing, image processing, etc.).

Other features and advantages of the invention are apparent from the following description, and from the claims.

DESCRIPTION OF DRAWINGS

FIG. 19 is a block diagram of an ECG system configured to process and digitize eight leads that are connected to a patient. The digitization is accomplished using one ADC per lead.

DESCRIPTION

1 Charge Sharing

In general, a charge sharing approach described herein makes use of switched phases in which different sets of capacitors are coupled such that their charges are shared in a process of voltage equilibration. Signal values can be represented as charges (or equivalently considered voltages proportional to signal values) on capacitive elements (hereinafter referred to as "capacitors" recognizing that a variety of circuit elements may be used to present a capacitive or charge storage characteristic). In some cases, a signal value is presented, for example, at an input or after an intermediate active buffer, in voltage form, and can be converted to a charge representation by coupling the voltage to a capacitor. The process of charge transfer between capacitors has an inherent scaling behavior according to the sizes of the capacitors. For example, if a charge $q_1$ on a capacitor of capacitance $c_1$ (i.e., with a voltage $v_1 = q_1/c_1$) is coupled to a second (discharged) capacitor with capacitance $c_2$, and then decoupled after the charges equilibrate, the resulting charge on the second capacitor is $q_2 = (c_2/c_1+c_2)q_1$.

Therefore there is a scaling by the factor $(c_2/c_1+c_2)$. Design-time selection and/or runtime control of the capacitance values can be used to determine the scaling factors.

Figure 1A:
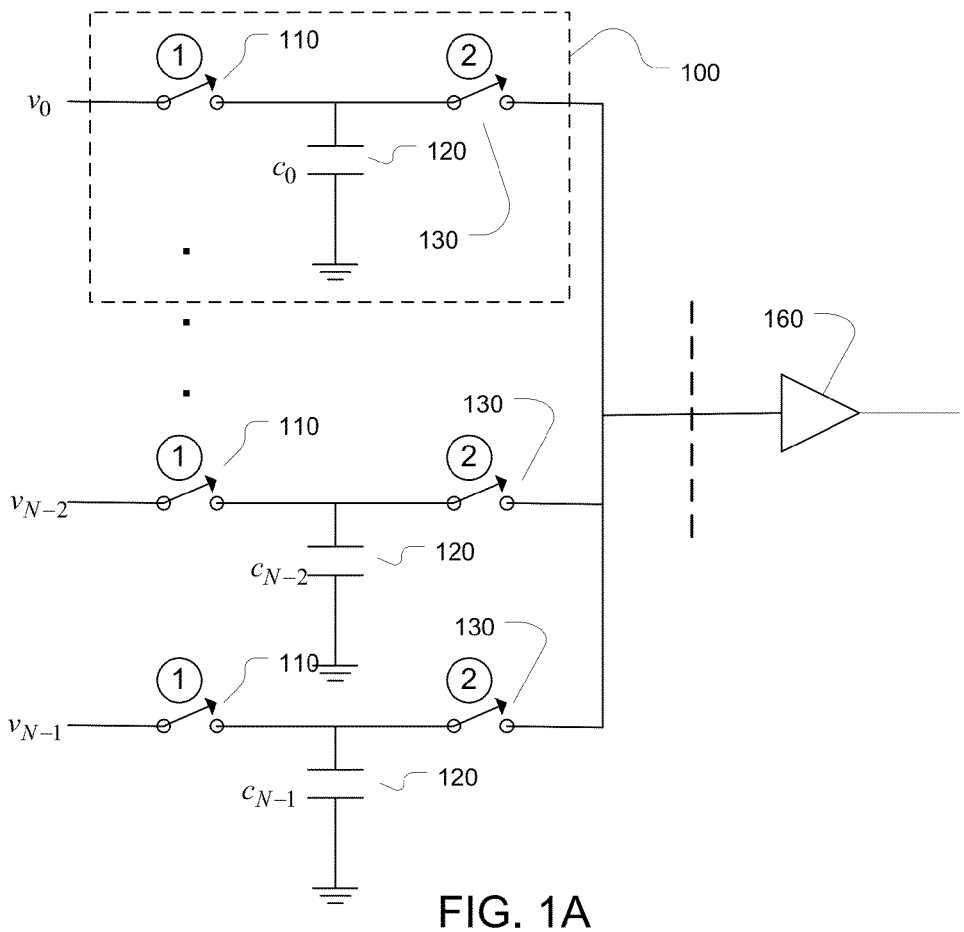
FIGS. 1A-B are passive charge sharing circuits for forming a weighted linear combination in input signal values.

Referring to FIG. 1A, an example of a circuit that makes use of charge sharing has a set of N capacitors 120 that have capacitances $c_0$ through $c_{N-1}$. The circuit operates in a sequence of phases such that in each phase, different subsets of capacitors are coupled to one another and/or coupled to inputs or outputs of the circuit. The circuit includes N input sections 100, such that in each input section a capacitor is coupled to corresponding voltage input $v_0$ through $v_{N-1}$ through a switch 110, which is closed during phase 1, while a second switch 130 remains open. The capacitors are therefore charged during phase 1 to charges of $q_i = c_i v_i$ (assuming sufficient time passes for the voltages across the capacitors to reach the voltage inputs). At the end of phase 1, the switches 110 are opened leaving the charges on the capacitors 120.

In phase 2, the capacitors 120 are coupled together through switches 130 that are closed forming a parallel combination of capacitors 120 with a total capacitance of $c_{tot} = \Sigma_{i=0}^{N-1} c_i$. The total charge on the capacitors, $q_{tot} = \Sigma_{i=0}^{N-1} q_i$, is therefore shared among all the coupled capacitors, resulting in an equilibration of the voltages across the capacitors that reaches a final output voltage of $v_{out} = q_{tot}/c_{tot} = 1/c_{tot} \Sigma_{i=0}^{N-1} c_i v_i$ across the capacitors. Assuming that sufficient time is provided for the charges to equilibrate, at the end of phase 2, this output voltage is passed to a buffer 160, such as an amplifier. In this example, the buffer 160 presents a high impedance at its input, thereby not affecting the charge sharing among the capacitors 120.

Figure 1B:
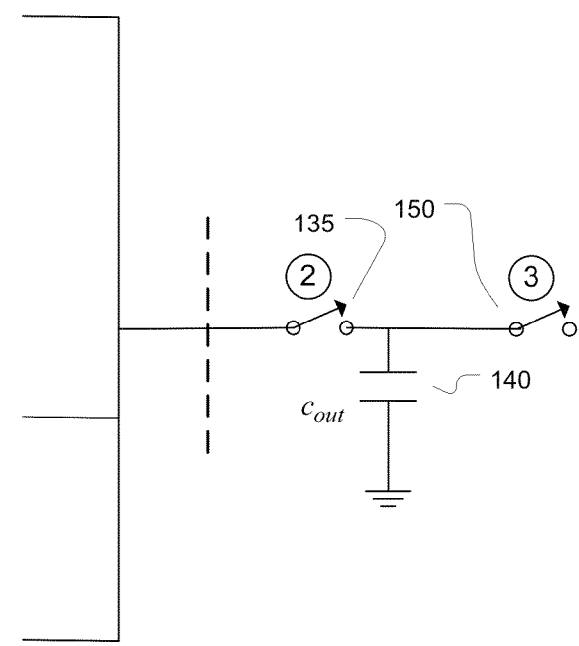
Figure 2:
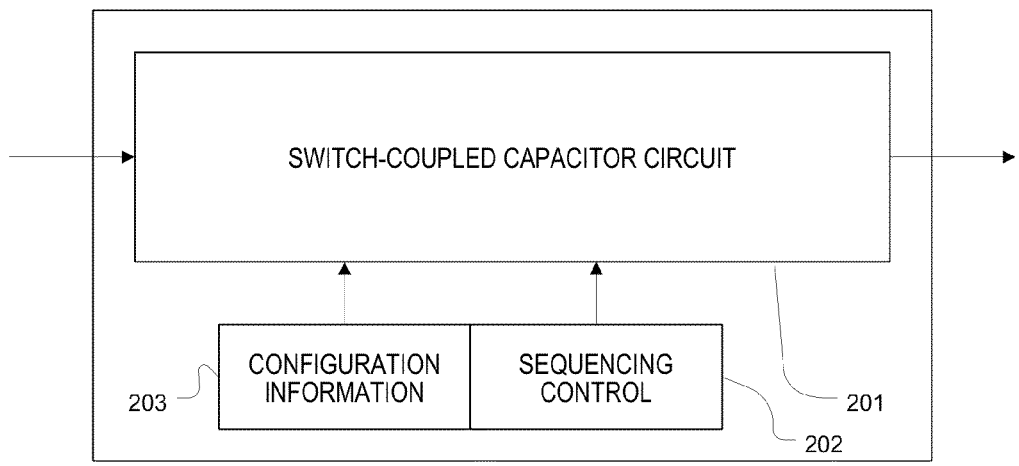
FIG. 2 is a block diagram of a configurable charge sharing analog signal processor.

Referring to FIG. 1B, in an alternative output arrangement, an output capacitance $c_{out}$ 140 is coupled through a switch 135 to the capacitors 120, forming a total capacitance of $c_{tot} = c_{out} + \Sigma_{i=0}^{N-1} c_i$. The total charge on the capacitors, $q_{tot} = \Sigma_{i=0}^{N-1} q_i$, is therefore shared among all the coupled capacitors. Assuming that the output capacitor is initially uncharged at the start of phase 2 when switch 135 is closed (e.g., using a discharge circuit that is not shown), a charge of $q_{out} = (c_{out}/c_{tot}) \Sigma_{i=0}^{N-1} c_i v_i$ is transferred to the output capacitor 140. At the end of phase 2, the switches 130, 135 are opened leaving the output voltage and output charge on the output capacitor 140. In the example of FIG. 2, in phase 3, a switch 150 closes coupling the output capacitor 140 to further circuitry, for instance, to further circuitry in which the charge on the output capacitor 140 is shared among a set of capacitors.

Note that the circuits in FIGS. 1A-B effectively form a linear combination of the inputs. For example, $v_{out} = \Sigma_{i=0}^{N-1} h_i v_i$ where the coefficients $h_i$ are proportional to the capacitances $c_i$. In some examples, the capacitors are fixed and are fabricated to achieve desired scaling of signal values in the circuit. Examples of charge sharing circuits, for example, in which capacitor values are statically set, as described in U.S. Pat. Pub 2010/0207644A1, titled "Analog Computation."

In some examples, the capacitors are configurable (e.g., programmable), and are set to achieve the desired coefficient values. For example, a capacitance may be selected at runtime to achieve a final charge proportional to $h_i v_i$ after one or more charge sharing stages after the signal voltage $v_i$ is received.

Referring to FIG. 2, in some implementations, a charge sharing analog processor includes a switch-coupled capacitor circuit 201 (e.g., a circuit made up of capacitors that are switchably interconnectable in a variety of configurations, for example, by transistor switches). The circuit 201 generally includes variable or configurable capacitive elements, for example, formed of switchably connectable fixed capacitors, or formed from directly controllable variable capacitors. A sequencing control 202 element is used to move through sequences of interconnected configurations of the circuit 201 in order to achieve a desired signal processing function. Configuration information 203 is used to control the sequencing and/or control characteristics of elements in the circuit 201. An example of circuitry 201 is the configuration shown in FIG. 1B, but it should be understood that a wide range of configurations can be used.

2 Scaling Using Successive Phases

Figure 3A:
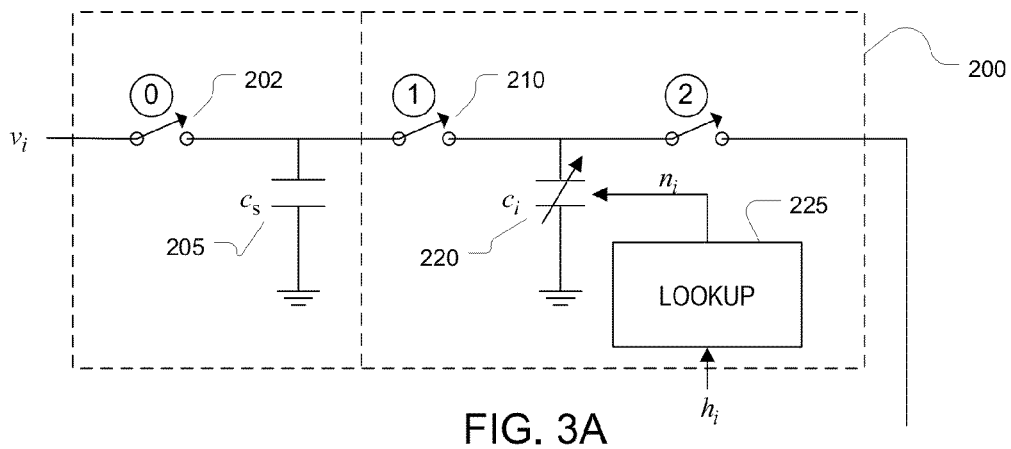
FIGS. 3A and 3B are passive charge sharing circuit for forming a configurable scaling of an input signal value.

In another circuit example, each circuit section 100, indicated in dashed lines in FIG. 1A, is replaced by a circuit section 200 as shown in FIG. 3A. In each circuit section 200, a voltage input $v_i$ charges a sampling capacitor 205 with capacitance $c_s$ through a switch 202 during a phase 0, and then in next phase 1, the capacitor 205 is coupled to a capacitor 220 through a switch 210.

During phase 0, an input charge $q_s = v_i c_s$ is deposited on the input capacitor 205.

During phase 1, a portion of the charge, $$q_i = q_s \frac{c_i}{c_i + c_s} = v_i \frac{c_i c_s}{c_i + c_s},$$

is transferred from the input capacitor 205 to the capacitor 220. Then, as in the circuit in FIG. 1, in phase 2 the capacitors 220 are coupled together so that the output is proportional to the sum of the charges on the capacitors 220. In this example, the overall output (as a voltage) is equal to $$v_{out} = \sum_{i=0}^{N-1} v_i \frac{c_i c_s}{c_i + c_s} \bigg/ \sum_{i=0}^{N-1} c_i.$$

Figure 3B:
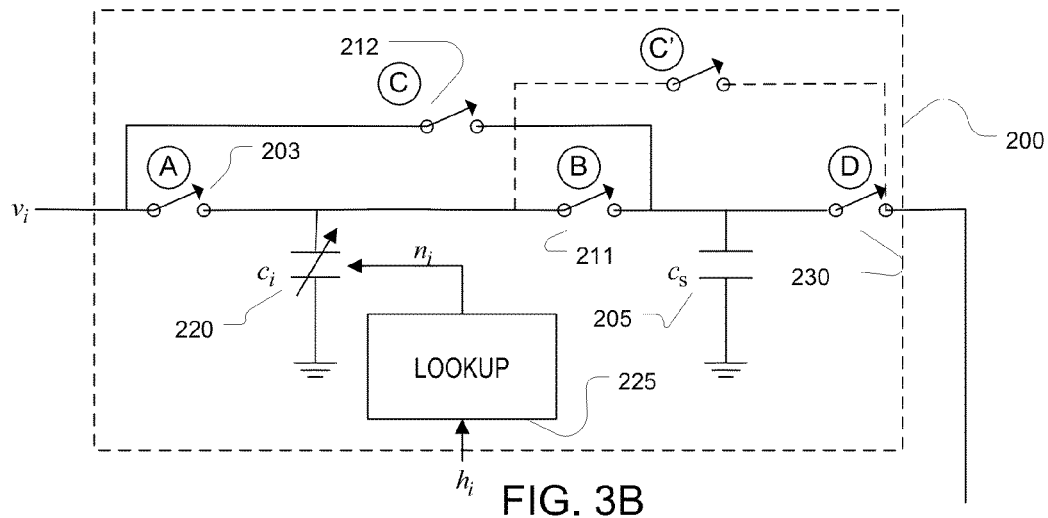

Referring to FIG. 3B another example of a passive scaling circuit provides hybrid behavior using different sequences of sharing phases. As shown in the figure, the configurable capacitor 202 can be charged from the input via a switch 203 labeled "A". Charge can be shared between capacitors 220 and 205 via a switch 211 labeled "B". The capacitor 205 can also be charged directly from the input via switch 212 labeled "C". Finally, the stored charge on capacitor 205 (or 220) can be provided to further processing stages via the switch 230 labeled "D". Not that depending on the sequence of switch closings, different charge and/or voltage that is a configurable multiple of the input signal can be provided to the further processing stages. For example, the sequence (Phase 1: A; Phase 2: B; Phase 3: D) first charges capacitor 220 to a charge determined by the configuration value, and then in the second phase shares a portion of the charge with capacitor 205. In a different sequence (Phase 1: C; Phase 2: B; Phase 3 D), the capacitor 205 is first charged to the input voltage, and then a configurable fraction of that charge is shared with capacitor 220. Note that these sequences of phases are not exhaustive, and even with the circuit shown in FIG. 3B, yet other scaling factors from input voltage $v_i$ to resulting charge $q_s$ on capacitor $c_s$ can be achieved in multiple (e.g., two or more) sharing phases.

Note that in the examples shown in FIGS. 3A-B, the capacitors shown as fixed capacitors may be variable capacitors and/or variable capacitors may be fixed. Also other interconnections by switches can be introduced to allow different sequences of charge sharing. For example, in FIG. 3B, a switch C' can be introduced as shown by the dotted circuit line. In such a configuration, the final charge may be provided from capacitor 220 rather than capacitor 205.

Figure 4:
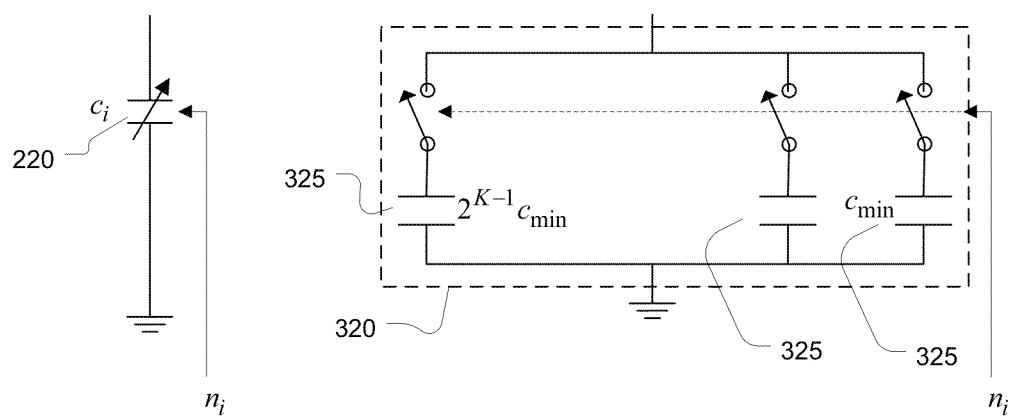
FIG. 4 is an example of a configurable capacitance circuit.

Referring to FIG. 4, in some implementations, each capacitor 220 in FIG. 2 is implemented as a configurable capacitor 320 that is configured according to a K–bit control number, $n_i$ such that the capacitance $c_i = c_{min}$. In some examples, the capacitance is configured by using K capacitors 325 with values $(2^{K-1} c_{min}, 2^{K-2} c_{min}, \ldots, c_{min})$, each of which is coupled via a switch according to a corresponding bit for a base 2 representation of $n_i$ from highest to lowest order bit such that $c_i = \Sigma_{K=0}^{K-1} \text{bit}_k(n_i) 2^k c_{min}$. Note that other types of controllable capacitors, either with digital or analog control values, can be used, and that the configuration shown in FIG. 4 is only an example.

Note that although a configurable capacitor 320 is treated as a single capacitive element, in the example shown in FIG. 4, the capacitance is determined by the configuration of the K switches to the fixed capacitors. Therefore, the selection of the capacitance can also be thought of a part of the sequencing of the switches that cause the charge sharing among sets of fixed capacitors.

In other examples, what is represented as a variable capacitor, for example, as shown in FIGS. 3A-B is itself replaced in a somewhat recursive manner with a multiple phase structure, as shown in FIGS. 3A-B. For example, the structure in FIG. 4, when a voltage is applied to at the input, yields a controlled charge and voltage as an output. In a multiphase "variable capacitor", a voltage (or charge) is applied at an input at a first phase, and after multiple phases, a controlled charge and/or voltage is provided at the output.

As shown in FIGS. 3A-B, the input is considered to be a voltage (e.g., an ideal voltage source), which at the first phase is available to charge capacitors coupled to the input according to a $q = v_i c$ characteristic. In other examples, the input is considered to be a voltage on a finite capacitance element. Therefore, on the first phase when the input is accepted, the input is available to charge capacitors coupled to the input in a charge sharing mode such that a fraction of the charge on the finite capacitance element is passed or shared with capacitors in the circuit. In some examples, the capacitor on which the input voltage/charge is presented is available to participate in further charge sharing phases during the scaling operation, and the final output may be provided on that same capacitor, effectively scaling the charge on the input capacitor by a controlled factor in the range 0 to 1.0.

Referring back to FIG. 3, note that the scaling between each capacitor configuration value $n_i$ and the corresponding input $v_i$ in the output is not linear (particularly when $c_s$ is not substantially larger than $c_{min}$). In particular, the charge $q_i$ transferred to the capacitor 220 is not proportional to $n_i$. Rather, the charge is $$q_i = v_i f(n_i) = v_i \frac{n_i c_{min} c_s}{n_i c_{min} + c_s}.$$

The function $$f(n_i) = \frac{n_i c_{min} c_s}{n_i c_{min} + c_s} = \frac{n_i c_{min}}{n_i c_{min}/c_s + 1}$$

(as a function of the control number n for the variable capacitor) has units of capacitance, and can be considered as the effective capacitance of a circuit as shown in FIG. 1 where the capacitors 120 are directly charged by the voltage input. In some examples, in order to achieve a desired set of coefficients $-1 \le h_i \le 1$ such that as closely as possible $v_{out} \propto \sum_{i=0}^{N-1} h_i v_i$, configuration values $n_i$ are chosen to minimize $$\left\| |h_i| - \frac{f(n_i)}{f_{max}} \right\|,$$

where in general $f_{max} = \max_n f(n)$ (which in this example in which f(n) is monotonic yields $f_{max} = f(2^K - 1)$) according to a desired norm (e.g., absolute difference, squared difference, etc.). This choice of configuration values $n_i$ approximates a linear relationship between $h_i$ and $q_i$, the charge transferred to the capacitor 220 during phase 1. In some implementations, the desired coefficient values $h_i$ (or in some examples scaled integer representations of the coefficient values) are passed through a lookup table 225 to select a corresponding configuration value $n_i$. Note that in various embodiments such tables 225 may correspond to one or more hardware based tables (e.g., addressable memory) or may be implemented in software in procedures that map between desired coefficients and configuration values. In some implementations, the mapping is calculated, for example, by analytically determining $f^{-1}()$ or by other analytic or numerical procedures.

One approach to building a table for a table lookup 225 is map integers $i \in \{0, \ldots, 2^K - 1\}$ to corresponding values $0 \le n_i \le 2^K - 1$ such that $$n_i = \operatorname{argmin}_n \left\| \frac{i}{2^K - 1} - \frac{f(n)}{f_{max}} \right\|.$$

For a desired magnitude of coefficient h, the integer value of $j = \operatorname{round}((2^K - 1)|h|)$ is used look up $n_j$ which is used to configure the capacitor array 320 shown in FIG. 4.

Figure 5A:
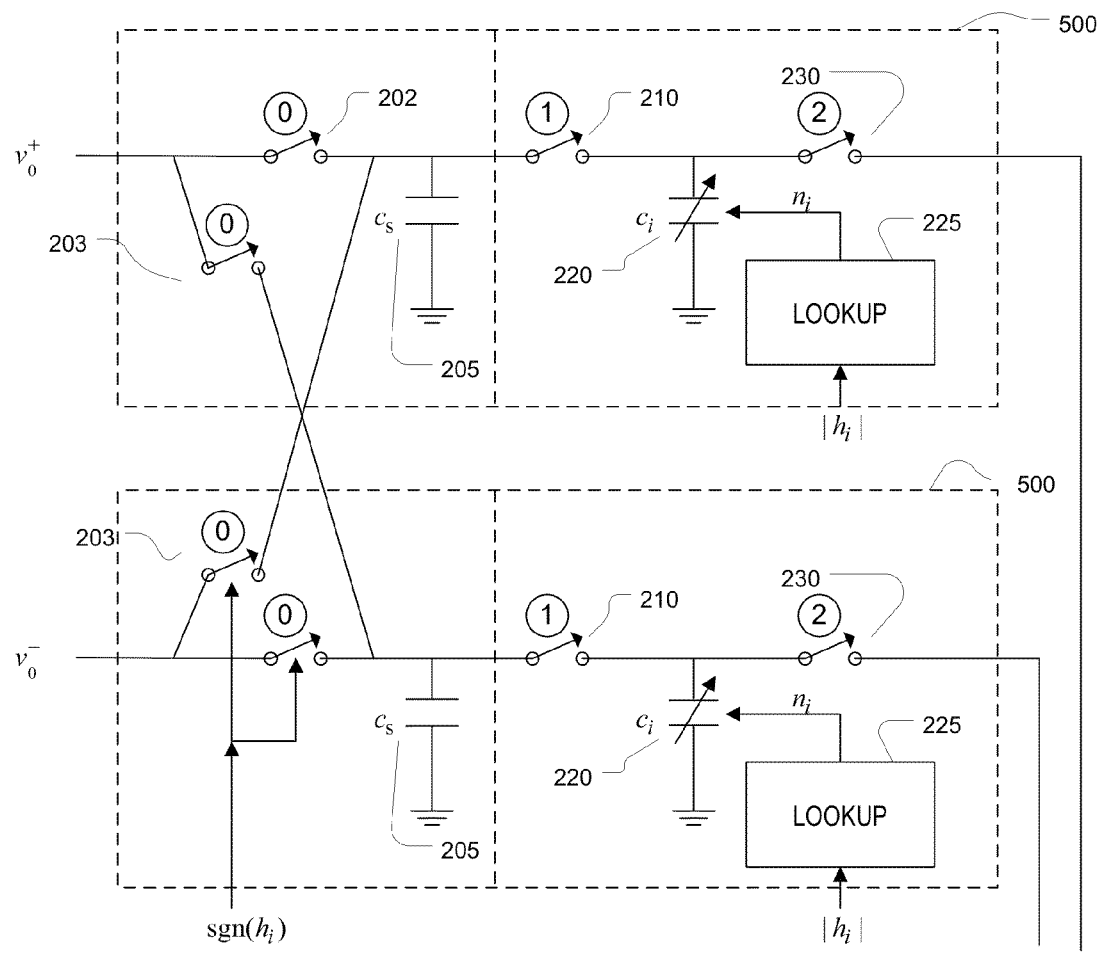
FIG. 5A-B are passive charge sharing circuit for forming a configurable signed scaling of an input signal value represented using differential signals.
Figure 5B:
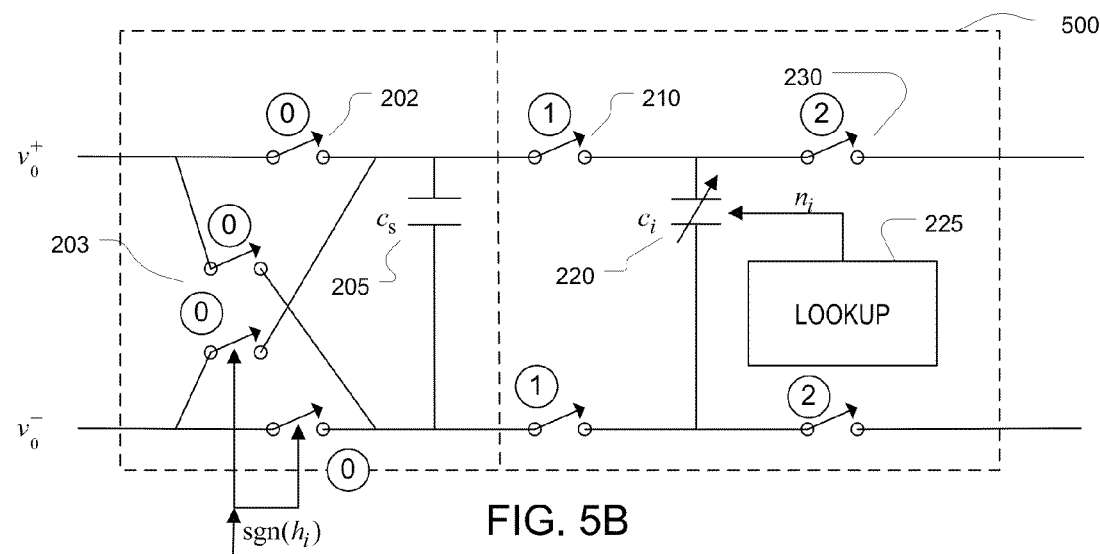

Note that the approach described above addresses the absolute value of the filter coefficients. In examples in which positive and negative coefficients (and/or positive and negative signal values) are used, one approach is to represent each signal value as a differential pair of signals, such that the common mode component is ignored, for example representing a signal $v_i$ as $v_i = v_i^+ - v_i^-$. As shown in FIG. 5A, a differential implementation of an input section 200 shown in FIG. 3A includes two input section 500. For negative coefficients, the inputs are reversed via switches 203 during phase 1 such that the negative differential is applied to the sections, while for positive coefficients, switches 202 are used. The lookup 225 uses the absolute value of the desired coefficient as input. In another approach to processing differentially encoded signals with signed coefficients, rather than using two capacitors 205, a single capacitor bridges the two signal paths (i.e., between the outputs of switches 202). Similarly, in this approach, a single configurable capacitor 220 bridges the signal paths (i.e., between the outputs of switches 210). In another configuration, rather than having differential capacitors that are each tied to a common mode (e.g., ground), floating capacitors are used as shown in FIG. 5B.

Characteristic of this and alternative arrangements of the capacitors include the total capacitance, which is related to the circuit area required to implement the capacitors on an integrated circuit, and the ratio of the largest to the smallest capacitor. In the linear array arrangement shown in FIG. 4, the total capacitance for a K-bit array is $(2^K - 1)c_{min}$ and the ratio of largest to smallest is $2^{K-1}$.

Other characteristics of the capacitor arrangement relates to the approximation of the desired coefficient $h_i$ using the available functions $f(n_i)$ for possible configuration values $n_i$. One measure of quality of the approximation relates the input $h_i$ to the achievable transfers of charge $q_i = v_i f(n_i)$ for the discrete values of $n_i = 0, \ldots, 2^{K-1}$. An Integral Non-Linearity (INL) that is achieved can be defined as $$INL(i) = \left( \frac{i}{2^K - 1} - \frac{f(n_i)}{f_{max}} \right)$$

where $n_i$ is the $i^{th}$ value of the lookup table as defined above. Similarly, a Differential Non-Linearity (DNL) can be defined as $$DNL(h) = \frac{f(n_i) - f(n_{i-1})}{f_{max}} - 1.$$

Figure 6:
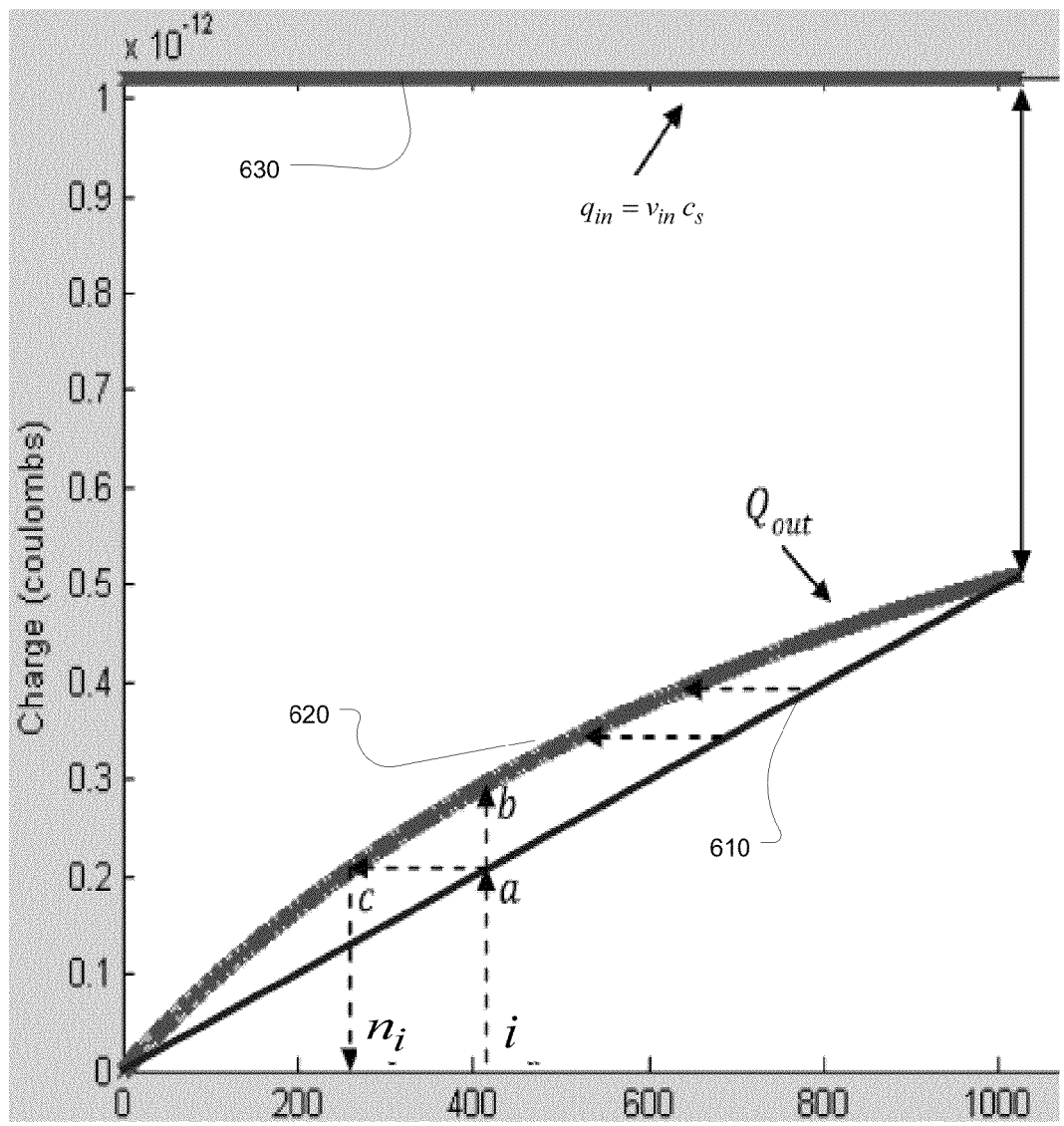
FIG. 6 is a graph is graph showing stored charge as a function input and mapped control values for a fixed input signal.

Referring to FIG. 6, charge transfer for a circuit as shown in FIG. 3 in which the variable capacitor 220 is implemented as shown in FIG. 4 with K=10 (i.e., $2^K - 1 = 1023$, and $c_s = (2^K - 1)c_{min}$. The line 610 represents the ideal straight line to which we can map actual charge transferred to capacitor 220 for different values of $i = (2^K - 1)|h|$ ranging from 0 to 1023. An ideal implementation of would be expected to yield the charge output on the straight line at point "a" for a particular value of i. Due to the non-linear charge transfer operation, if a value i were used directly to control the variable capacitor, the transferred charge would be at a point "b" on line 620 that is actually created at the output. In particular, as indicated above, line 620 take the form $$q_{out} = v_{in} f(n_i) = v_{in} \frac{n_i c_{min} c_s}{n_i c_{min} + c_s}$$

To compensate for this effect, the lookup table maps the value i to the value $n_i$ to generate the same charge we would expect at point "a", but at point "c" instead. For reference, the charge transferred to the sampling capacitor 205, which is equal to $$g_{in} = v_{in} c_s,$$

is shown for reference. In this example in which $c_s = (2^K - 1) c_{min}$, the output charge takes the form $$q_{out} = v_{in} f(\tilde{h}(2^K - 1)) = v_{in} c_s \frac{\tilde{h}}{\tilde{h} + 1}$$

For instance, instance at the largest value of i, approximately one half the input charge $g_{in} = v_{in} c_s$ on the sampling capacitor 205 is transferred as the output charge $q_{out}$ on the variable capacitor 220.

3 Time Domain Filters

Approaches described in this document are applicable to the implementation of both Finite Impulse Response (FIR) and Infinite Impulse Response (IIR) time domain filters.

3.1 FIR Filters

FIR filters are commonly represented by the following equation which shows that FIR filtering can be accomplished by weighting and summing input samples:

$$\frac{Y(z)}{X(z)} = b_0 + b_1 z^{-1} + b_2 z^{-2} \ldots$$

One approach to implementing an N-tap Finite Impulse Response (FIR) Filter is described in U.S. Pat. Pub 2010/0207644A1, titled "Analog Computation." Generally, input voltages signals are used to charge capacitors with capacitances selected to implement the transfer function $y(t) \propto \Sigma_{i=0}^{N-1} b_i x(t-i)$ using the approach shown in FIG. 2. In order to support the "destructive" use of the charges stored on capacitors used to form the weighted combinations, each input voltage x(t) is used to charge N separate capacitors that will be used to form the N outputs that make use of that input sample.

Figure 7:
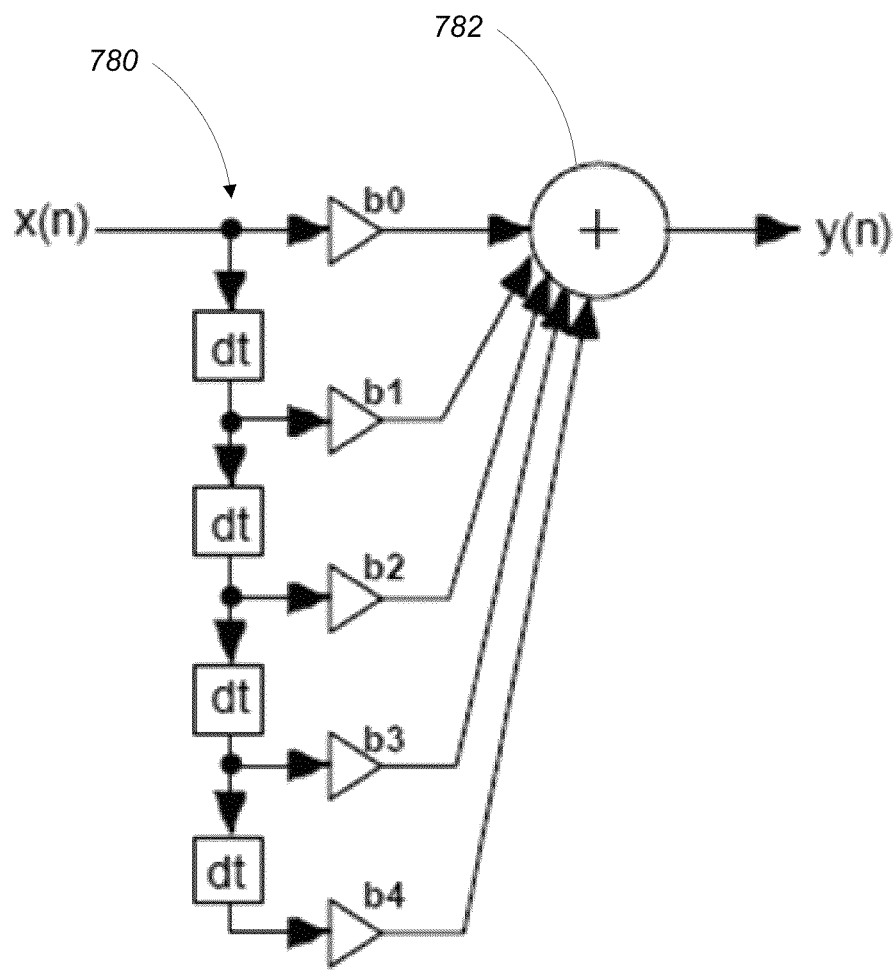
FIG. 7 is an FIR filter architecture.

Referring to FIG. 7, a block diagram illustrates another architecture of an FIR filter which implements the above equation. The filter receives an input signal x(n), samples of which are fed to a delay line 780. Each of the samples in the tapped delay line 780 is scaled by a coefficient (i.e., $b_0, \ldots, b_4$) and the scaled samples are fed to a summing element 782 to form an output y(n).

Figure 8:
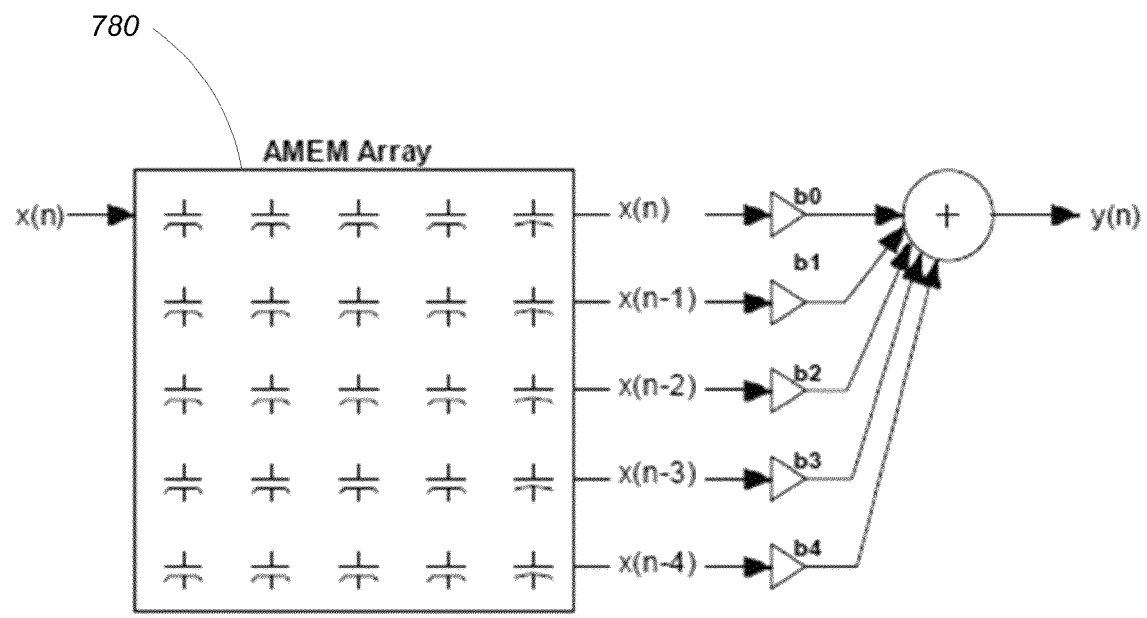
FIG. 8 is an FIR filter architecture including an analog memory.

Referring to FIG. 8, in an implementation of the architecture shown in FIG. 7, the delay line 780 is implemented with an analog memory ("AMEM") having $N^2$ elements such that each input sample is stored on N elements. For each output value, a set of N past stored analog values are passively scaled and combined through charge sharing to form the output proportional to the sum of the scaled values.

Figure 9:
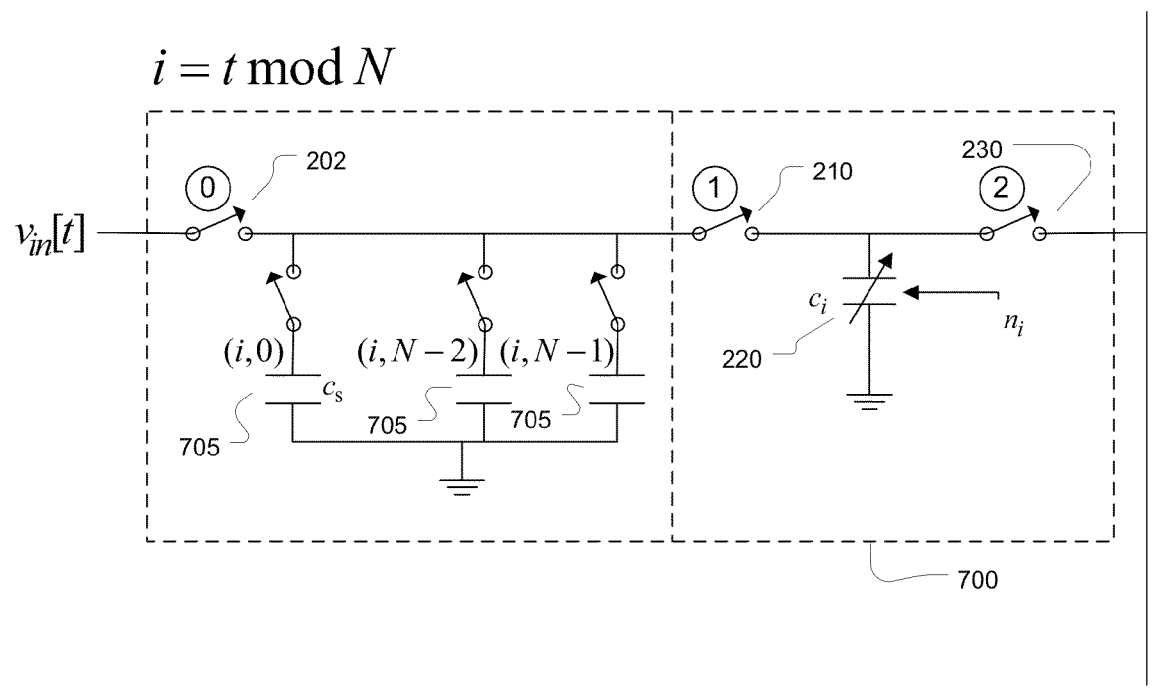
FIG. 9 is a multiple stage passive input scaling section.

Referring to FIG. 9, in which each capacitor in the AMEM array of $N^2$ capacitors 705 has a capacitance $c_s$ (as in FIG. 3). In this example, the sampling capacitors 705 are arranged in N sections 700, each with N sampling capacitors 705. For reference, the N sampling capacitors in the $i^{th}$ row are indexed (i, 0) through (i, N-1).

During phase 0 for an input at time t, the switches are closed such that the input voltage x[t] charges sampling capacitors with indices (t mod N,i) for i=0, ..., N-1.

During phase 1 for the input time t, the switches are closed such that in the section 700, the sampling capacitor 705 with index (i, t mod N) is coupled to the capacitor 220 in that section, which is configured to have capacitance $c_i$. Note that following the description of the circuit in FIG. 3, the at the end of phase 1, in the circuit of FIG. 9 the charge on the capacitor 220 in the row i=(t−j) mod N, for j=0, ..., N−1 is $$q_i = x(t-j) \frac{c_i c_s}{c_i + c_s}.$$

To implement an FIR Filter $y(t) \propto \Sigma_{i=0}^{N-1} b_j x(t-j)$ the configurable capacitors 220 are set at time t with the control value $n_i$ for setting capacitance $c_i$ according to the filter coefficient $b_j$ such that $$h_i \propto \frac{c_i c_s}{c_i + c_s}$$

where j=(i−t)mod N.

3.2 IIR Filters

The previously described filters have a finite impulse response due to the output of the filters depending only on the input to the filters. In some examples, the summing element of the previously described filters can be extended to include past values of the output, y(n), resulting in an infinite impulse response filter (IIR filter). The following equation is a typical mathematical representation of an IIR filter structure:

$$\frac{Y(z)}{X(z)} = \frac{b_0 + b_1 z^{-1} + b_2 z^{-2} + \ldots}{a_0 + a_1 z^{-1} + a_2 z^{-2} + \ldots}$$

Without loss of generality with only an overall scaling factor, we can set $a_0 = 1$, and the above equation can be rearranged as:

$$y(n) = (b_0 x(n) + b_1 x(n-1) + b_2 x(n-2) + \ldots) + (-a_1 y(n-1) - a_2 y(n-2) - \ldots)$$

Figure 10:
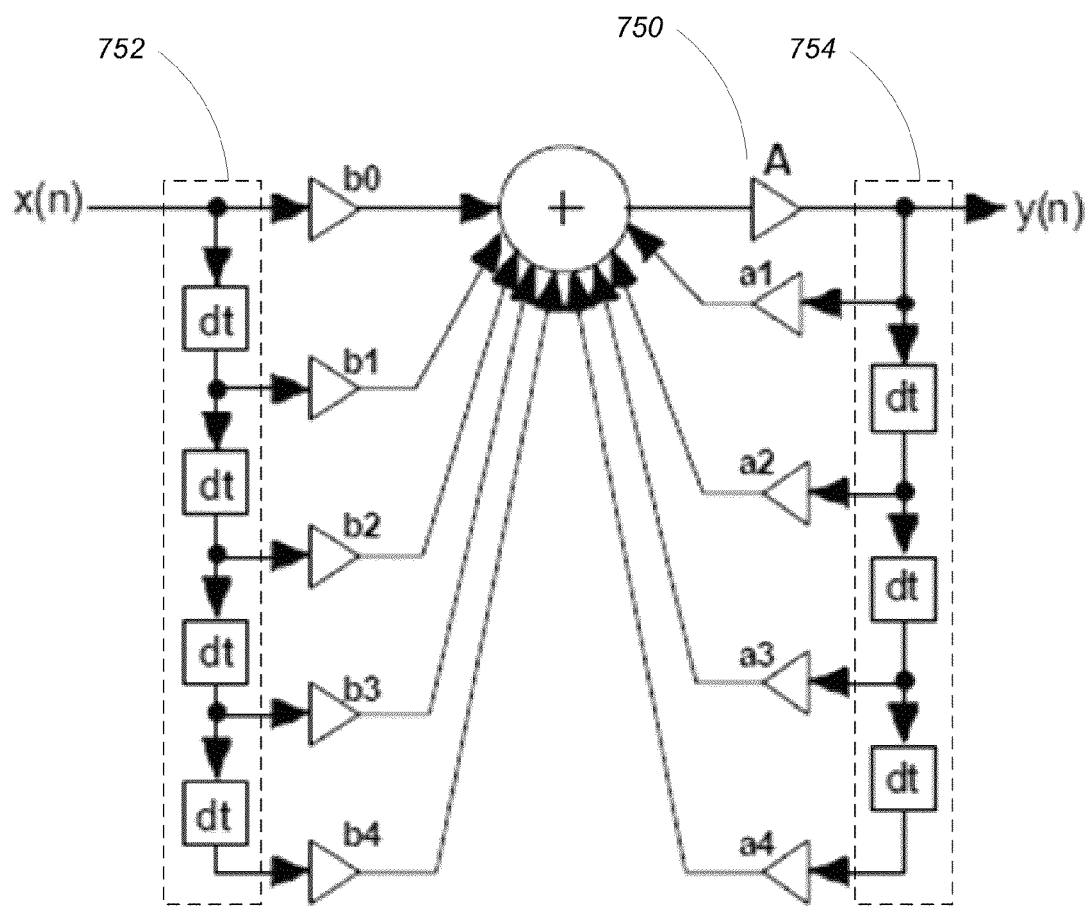
FIGS. 10 and 11 are IIR filter architectures.

Referring to FIG. 10, this equation can be implemented using charge sharing by having two analog memories: one analog memory 752 for copies of delayed samples of the input signal, as in the FIR case, which provide the terms of the first parenthesized expression above; and a second analog memory 754 for copies of delayed samples of the output, which provides the terms of the second parenthesized expression above. As introduced above in the FIR case, the charge sharing approach yields a value (charge) that is proportional to the desired output, but may be attenuated. In the IIR architecture shown in FIG. 10, a gain element 750, such as an active amplifier, is used to charge the elements of the output analog memory. The gain is selected along with scale factors applied at the outputs of the output analog memory 754 in order to achieve the desired relationship between the terms in the sum implemented by the charge sharing.

Figure 11:
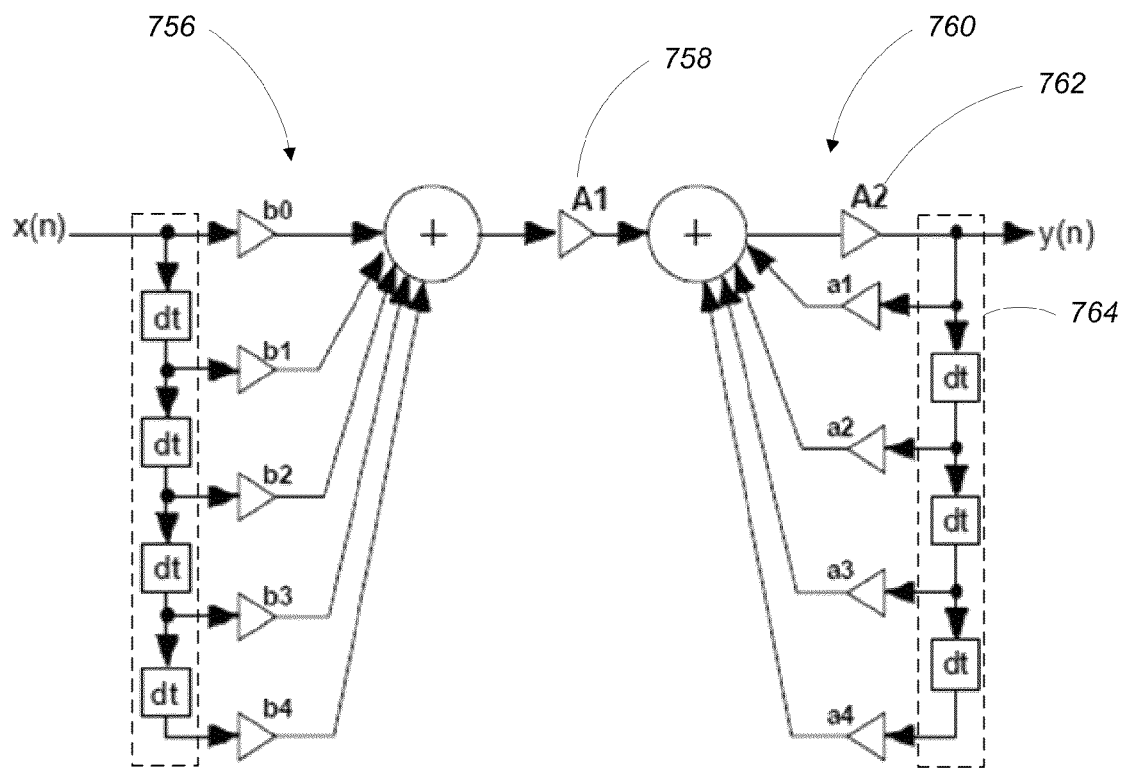

Referring to FIG. 11, in another architecture, the FIR component is implemented in one charge sharing stage 756, which is separated by a first gain element 758 from an all-pole IIR component implemented in a second charge sharing stage 760. The IIR component includes a second gain element 762, which is used to charge the elements of the output memory 764 in the manner described above with reference to FIG. 10.

4 Window Functions

The charge sharing approaches described above can be used to implement time domain or frequency domain windowing functions. One application of such a windowing function is applying a time domain window at the input of a discrete Fourier transform (DFT) block (e.g., as described in U.S. Pat. Pub 2010/0207644A1, titled "Analog Computation") when performing an algorithm such as spectral analysis of a streaming signal.

In an example of such an application, the window is applied to a block of time samples before the samples are provided to a DFT block. Applying the windowing function includes multiplying each of the time samples in the input block by a scaling coefficient before providing the time samples to the DFT block. The DFT block receives the windowed block of time samples as input and processes the block, yielding a frequency domain representation of the time samples included in the block.

In an unwindowed example of a DFT block, each of the voltage input signals $x(0)$ to $x(N-1)$ is used to charge one or more first stage capacitors such that the resulting charges are proportional to the product of the input signals and the capacitances. In some examples, it is desirable for the inputs to the DFT block to be equal or proportional to $x(0)w(0)$ through $x(N-1)w(N-1)$ (i.e., to window the input by $w(t)$). In some examples, a charge scaling circuit, for instance a circuit as shown in FIG. 3B can be used to accept the voltage signals $x(t)$ and deposit charges on the first stage capacitors that are proportional to $x(t)w(t)$.

Figure 12:
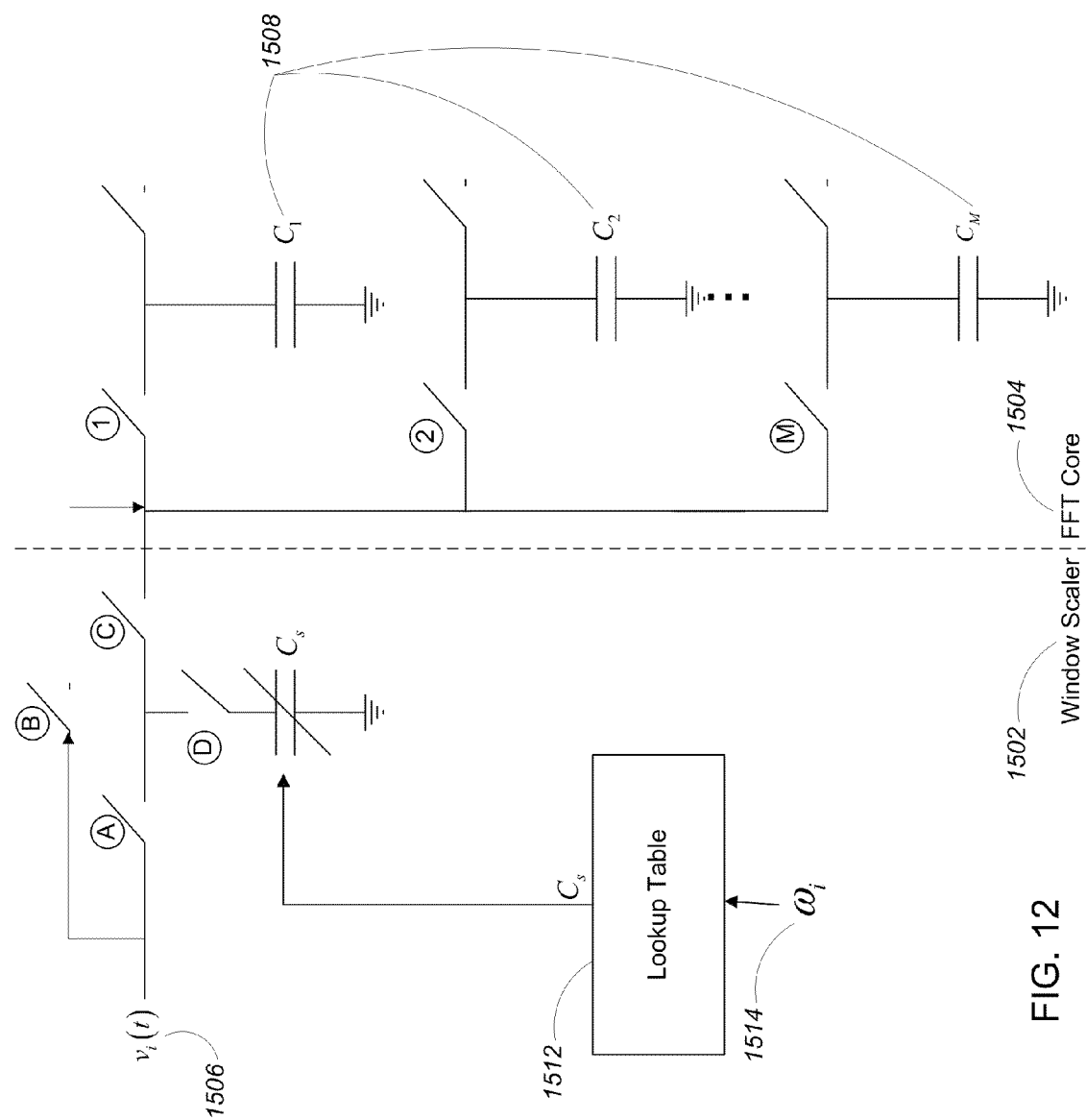
FIG. 12 is a circuit diagram for windowing a DFT input sample.

Referring to FIG. 12, a windowing scaler 1502 and charge sharing DFT core 1504 are configured to process one input sample, $v_i(t)$ 1506, of a block of time samples. The DFT core 1504 portion includes M (e.g., 2) first stage capacitors 1508. The window scaler 1502 portion includes a scaling capacitor 1510 with an adjustable capacitance, $C_s$, and a lookup table 1512. The lookup table 1512 receives a scaling coefficient, $w_i$ 1514 (i.e., the scaling factor specified by the windowing function for the input sample 1506), and determines which value, $C_s$, of the scaling capacitor 1510 achieves the desired scaling factor taking into account the number and capacitance values of the first stage capacitors 1508 in the DFT core 1504.

In general, there are two modes of operation for scaling the input sample 1506 using the circuit of FIG. 12. In general, the first mode fully charges the scaling capacitor 1510 and then shares the charge from the scaling capacitor 1510 to the DFT core first stage capacitors 1508. The second mode fully charges the DFT core first stage capacitors 1508 and then bleeds off a specified amount of charge from the first stage capacitors 1508 into the scaling capacitor 1510.

In the first mode of operation, a windowing coefficient, $w_i$ 1514, is received at the lookup table 1512. The lookup table 1512 determines the desired value, $C_s$, of the scaling capacitor 1510 as is described above and uses it to adjust the capacitance of the scaling capacitor 1510.

When the voltage input sample 1506 is received, switches A and D are closed while switch B remains open. This causes the scaling capacitor 1510 to fully charge. Switch A can then be opened, leaving the scaling capacitor 1510 charged. Switches C and 1, 2, ... M are then closed, causing the charge stored in the scaling capacitor 1510 to distribute to the first stage capacitors 1508 in the DFT core 1504. Due to the choice of the value of $C_s$, the charge distributed to each of the first stage capacitors 1508 is proportionally scaled according to $w_i$ 1514.

As was the case in the first mode of operation, in the second mode of operation, a windowing coefficient, $w_i$ 1514, is received at the lookup table 1512. The lookup table 1512 determines the desired value, $C_s$, of the scaling capacitor 1510 as is described above and uses it to adjust the capacitance of the scaling capacitor 1510.

When a voltage input sample 1506 is received, switch B and switches 1, 2, M are closed (i.e., leaving the scaling capacitor 1510 uncharged). This operation causes the first stage capacitors 1508 ($C_1, C_2, \ldots, C_M$) to fully charge. Switch B can then be opened, leaving the first stage capacitors 1508 charged. Switches C and D are then closed, causing the charge to bleed from the first stage capacitors 1508 and into the scaling capacitor 1510. After the charge has finished bleeding into the scaling capacitor 1510, the remaining charge on the first stage capacitors 1508 is proportionally scaled according to $w_i$ 1514.

While the preceding description applies to windowing time samples before a DFT operation is applied to the samples, the same windowing operation can be used to implement a frequency domain filter. In particular, frequency domain values representing an input signal can be windowed before an inverse DFT operation is applied. Applying the inverse DFT operation to the windowed frequency domain values results in a filtered version of the input signal.

5 Filter Design

In some examples in which an FIR or IIR filter is implemented using approaches described above, ideal coefficient values are first determined using conventional filter design approaches, and then the coefficient values are mapped to the best configuration settings for the charge sharing sections.

Figure 18A:
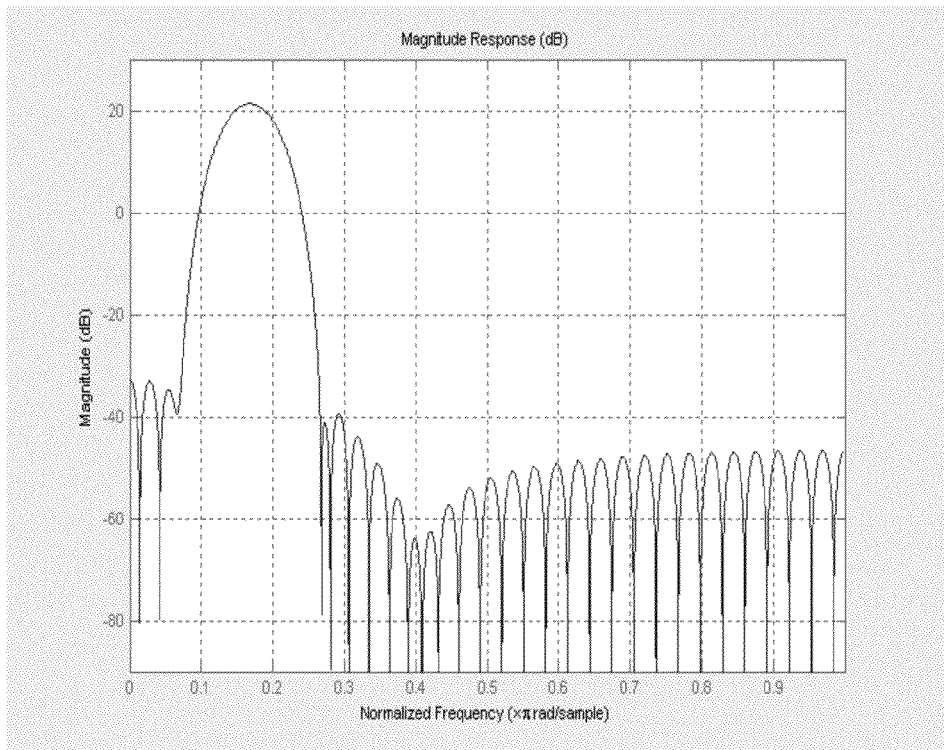
FIGS. 18A-D are frequency response plots.
Figure 18B:
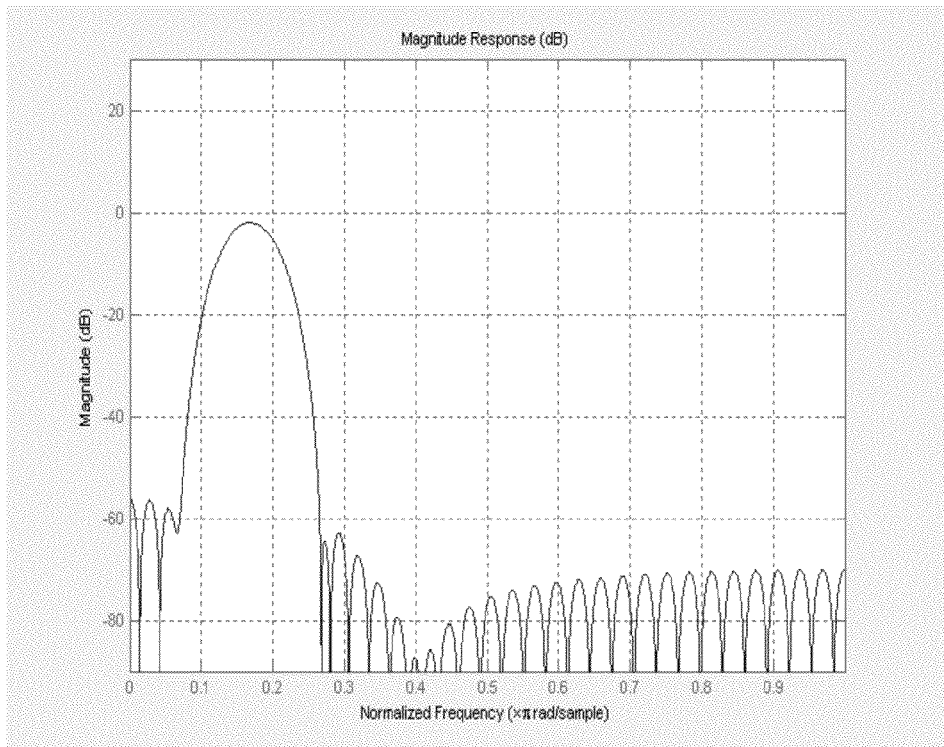
Figure 18C:
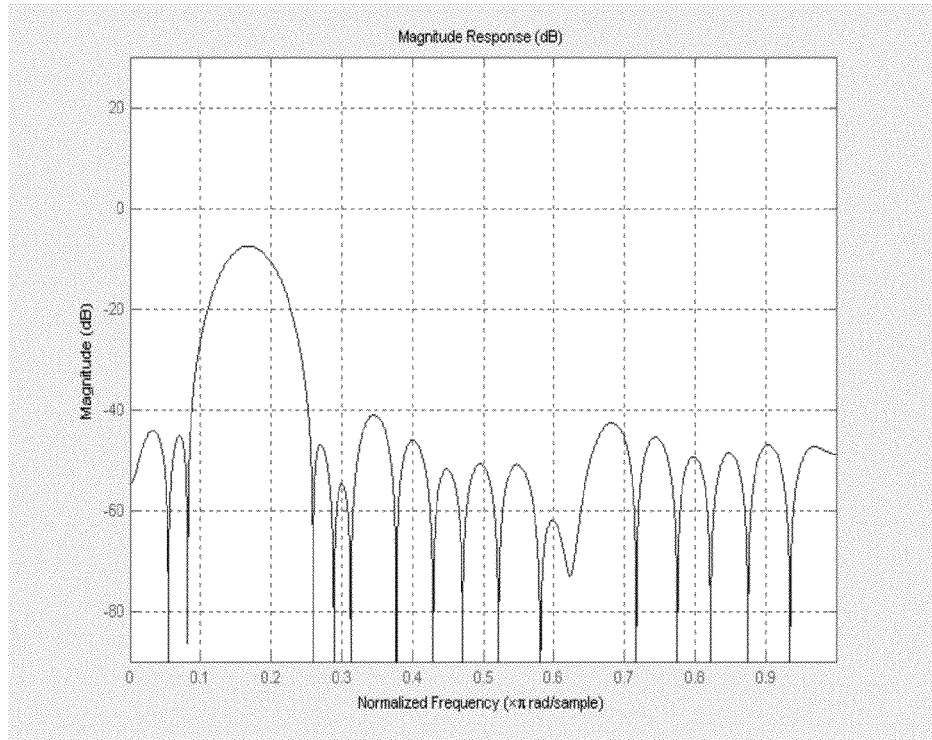
Figure 18D:
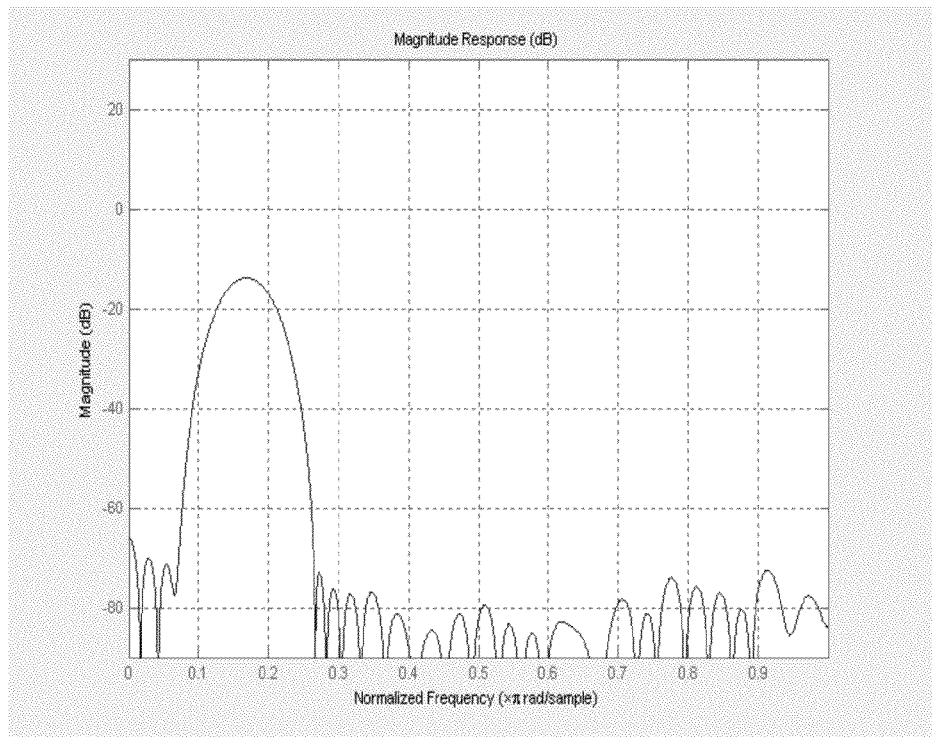

Referring to FIG. 18A, an example of a frequency response of a 64 tap band-pass filter using integer coefficients with 10-bit magnitude is shown. FIG. 18B illustrates the achieved frequency response using the approach shown in FIG. 3, with an example in which $c_s/c_{min}=13$. FIG. 18C illustrates the achieved frequency response using the approach shown in FIG. 13, with $c_c/c_{min}=3$ and $c_s/c_{min}=13$. Finally, FIG. 18D shows the achieved frequency response with the approach shown in FIG. 15, with $c_s/c_{min}=13$ and $c_c/c_{min}=3$.

In an alternative filter design approach, the constraints on realizable coefficient values are used during the optimization of the filter to achieve a desired response curve, for example, in an iterative optimization of coefficient values to minimize a deviation of an achieved frequency response from a target frequency response.

6 Alternative Configurable Capacitors

Referring back to FIG. 4, one example of a configurable capacitor 220 is used in which the capacitor is implemented as an array of capacitors with capacitances that are related by multiples of 2. In other examples, an array as shown in FIG. 4 does not necessarily have capacitances with such relationships. For example, the capacitances may be related by a multiples of a factor less than or greater than two, and may be irregularly multiplicatively or additively spaced.

Figure 13:
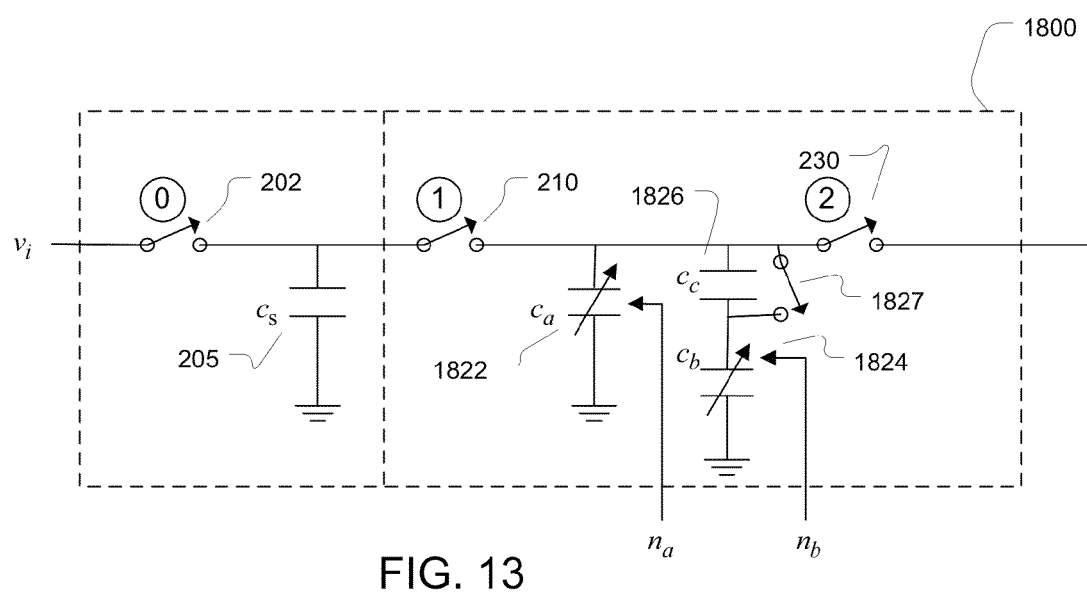
FIG. 13 is an example of a multiple stage passive input scaling section.

Referring to FIG. 13, in another example, a circuit section 1800 is used in place of the section 200 discussed above. This section includes the sampling capacitor 205, with capacitance $C_s$, and includes multiple configurable capacitors. A first configurable capacitor 1822, with capacitance $c_a$ configured by a value $n_a$, is in parallel with a series arrangement of a fixed capacitor 1824 with capacitance $c_c$ and a second configurable capacitor 1826, with capacitance $c_b$ configured by a value $n_b$. The capacitance of the combination of the three capacitors is therefore $$c_i = c_a + \frac{c_b c_c}{c_b + c_c}.$$

For example each of the configurable capacitors has a base 2 array such that $c_a = n_a c_{min}$ and $c_b = n_b c_{min}$. In some examples, a total of K bits are used to configure the two capacitors, and K/2 bits used for each of the values. Therefore, $n_a$ and $n_b$ each range from 0 to $2^{K/2} - 1$. The capacitor configuration value can be considered as a tuple $n_i = (n_a, n_b)$ or alternatively as an integer code value $n_i = {}_2K/2\ n_a + n_b$. The resulting effective capacitance in terms of the configuration values is therefore $$f(n_a, n_b) = \frac{c_i c_s}{c_i + c_s},$$

where $$c_i = c_a + \frac{c_b c_c}{c_b + c_c},$$

and $$c_a = n_a c_{min}$$

and $$c_b = n_b c_{min}.$$

In an example in which K=10, using power of two size capacitors, total capacitance for the two K/2-bit array is approximately $2^{K/2+1}$ and the ratio of largest to smallest is $2^{K/2-1}$.

In FIG. 13, a further switch 1827 can be introduced, thereby providing yet further modes of operation. For example, after capacitor $c_c$ is charged in a charge sharing phase, it can be discharged by closing switch 1827. Similarly, the capacitor $c_c$ can be effectively removed from the circuit by keeping switch 1827 closed.

Figure 14:
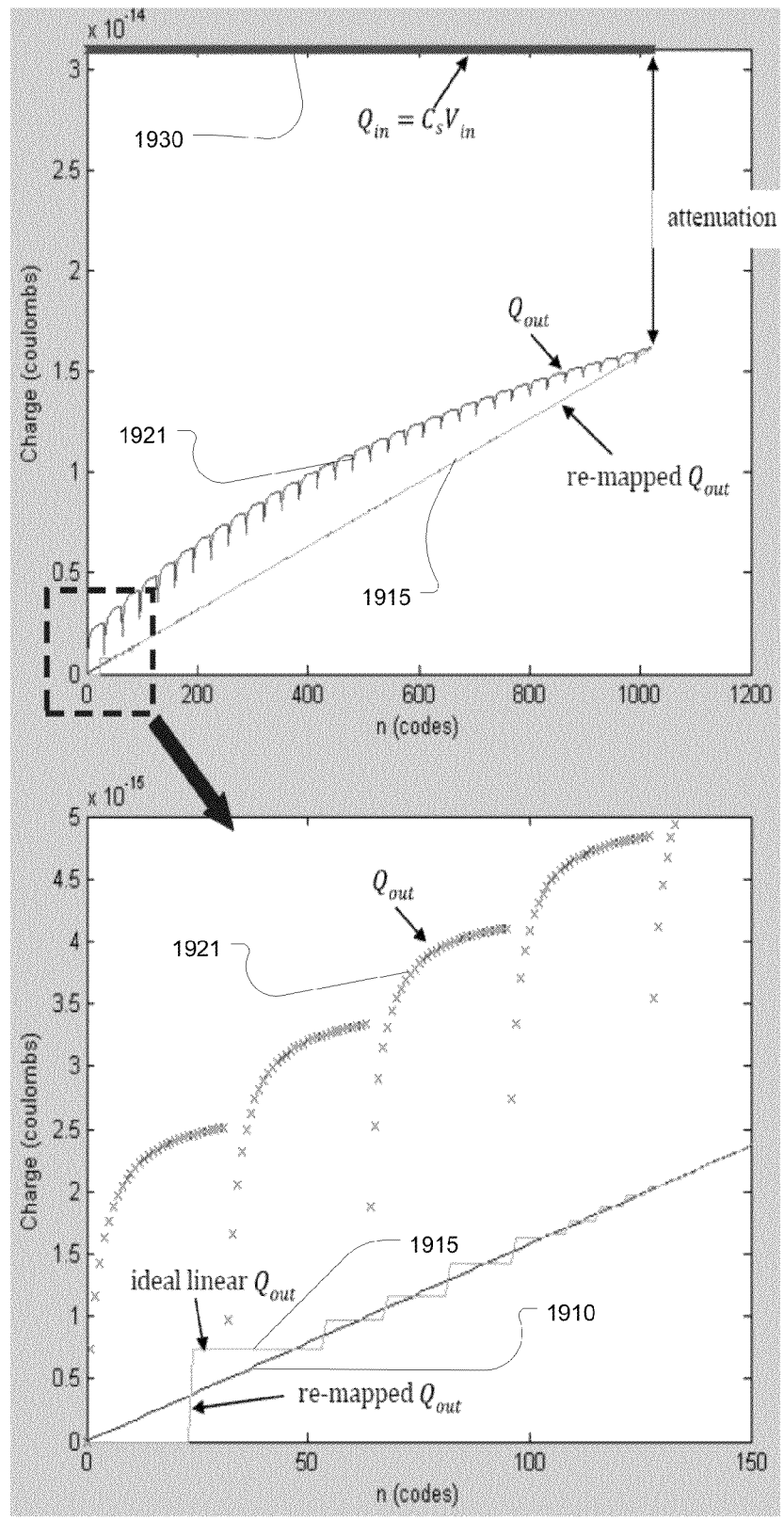
FIG. 14 is a graph of showing stored charge as a function input and mapped control values for a fixed input signal.

Referring to FIG. 14, for an example with K=10, $c_c = 3c_{min}$, and $$f_{max} = \frac{1}{2} c_s,$$

input and output charges as a function of code values $n = 2^{K/2} n_a + n_b$ from 0 to $2^K - 1$, in a form comparable to the graphs in FIG. 6. Curve 1921 shows the non-linearity without the mapping procedure if the codes are used directed, and curve 1915 shows the linearization the remapping procedure. Note that the capacitance f(n) is not a monotonic function of the integer code value $2^{K/2} n_a + n_b$.

Referring to the lower panel of FIG. 14, a portion of the graph in the upper panel of FIG. 14 is enlarged for coefficient and configuration values in the range 0 to 150

Note that in other examples, the different configurable capacitors may use different numbers of bits, and have different ranges of capacitor values.

7 Multiple Phase Sharing

Figure 15:
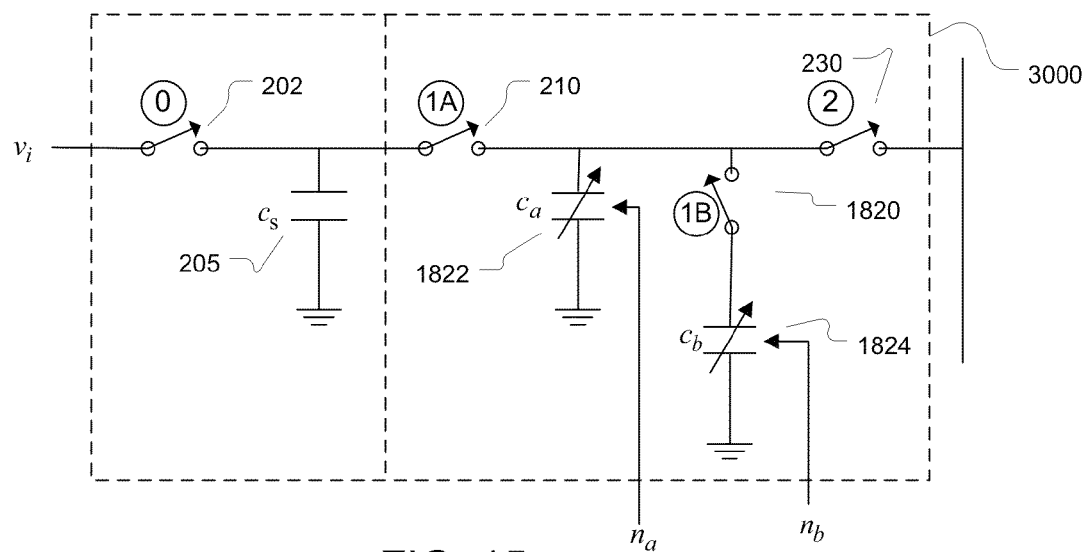
FIGS. 15 and 16 are examples of multiple stage passive input scaling sections each with multiple configurable capacitors.

Referring to FIG. 15, in another example a circuit section 3000 includes a network of multiple capacitors. In each circuit section 3000, a voltage input $v_i$ charges a capacitor 205 with capacitance $c_s$ through a switch 202 during a phase 0. Then, multiple phases of charge sharing are performed prior to phase 2 when switch 230 is closed to share a charge with other capacitors. In this example, there are two phases, labeled 1A and 1B that follow one another. In phase 1A, the sampling capacitor 205, which was charged with a charge $q_s = v_i c_s$ during phase 0, is coupled to capacitor 1822 through switch 210, resulting in a charge transfer to capacitor 1822 of $$q_a = q_s \frac{c_a}{c_a + c_s}.$$

In phase 1B, switch 210 is opened and switch 1820 is closed, resulting in a charge transfer to capacitor 1824 of $$q_b = q_a \frac{c_b}{c_a + c_b},$$

leaving a charge on capacitor 1822 of $$q_i = q_a \frac{c_a}{c_a + c_b} = v_s \frac{c_s c_a^2}{(c_a + c_s)(c_a + c_b)}.$$

During phase 2, switch 230 is closed and the other switches are opened. Therefore, the effective capacitance of this arrangement, assuming that each of the configurable capacitors is configured with respective values $n_a$ and $n_b$ is $$f(n_a, n_b) = \frac{n_a^2 c_{min} c_s}{(n_a c_{min} + c_s)(n_a c_{min})}.$$

Not shown is a switch to ground that drains the capacitor 1824, for example, during phase 1A, so that it begins discharged at the beginning of phase 1B.

Figure 16:
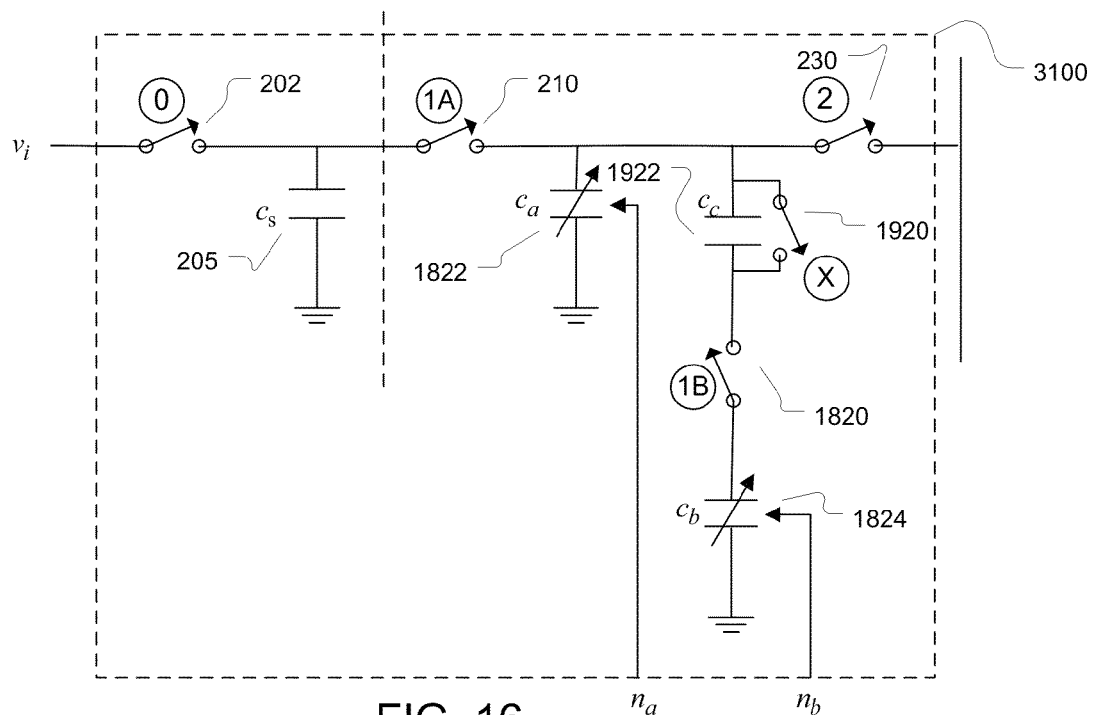

Referring to FIG. 16, in yet another example of a circuit section 3100, a capacitor 1922 is optionally coupled between capacitors 1822 and 1824. A switch 1922 can be closed to bypass the capacitor 1922, which if closed results in the circuit section 3100 operating in the same manner as the circuit section 3000 in FIG. 15.

With the switch 1920 opened, in phase 1B, the charge $q_a$ on capacitor 1822 is shared with the series arrangement of capacitor 1922, with capacitance $c_c$ and the configurable capacitor with capacitance $c_b$. This results is a transfer of $$q_b = q_a \frac{c_{bc}}{c_a + c_{bc}},$$

where $c_{bc} = (1/c_b + 1/c_c)^{-1}$ onto each of capacitors 1922 and 1824. Then, when in phase 2 the switch 1920 and switch 230 are closed and the remaining switches are opened, the remaining charge $$q_i = q_a \frac{c_a}{c_a + c_{bc}} = v_s \frac{c_s c_a^2}{(c_a + c_s)(c_a + c_{bc})}.$$

Note that if the configuration of the capacitors include a choice of operating mode depending on whether the switch 1920 is opened or closed during phase 1B, which can be indicated by a single bit s, then the overall configuration of the section 900 can be represented as $(n_a, n_b, s)$, and the effective capacitance is a function of these three values. Enabling multiple operating modes enables hybrid operation in which the best operating mode can be selected depending on the desired scale factor. With such a configuration, in an example in which K=10 and each of the capacitors being configured according to K/2 bits.

Figure 17:
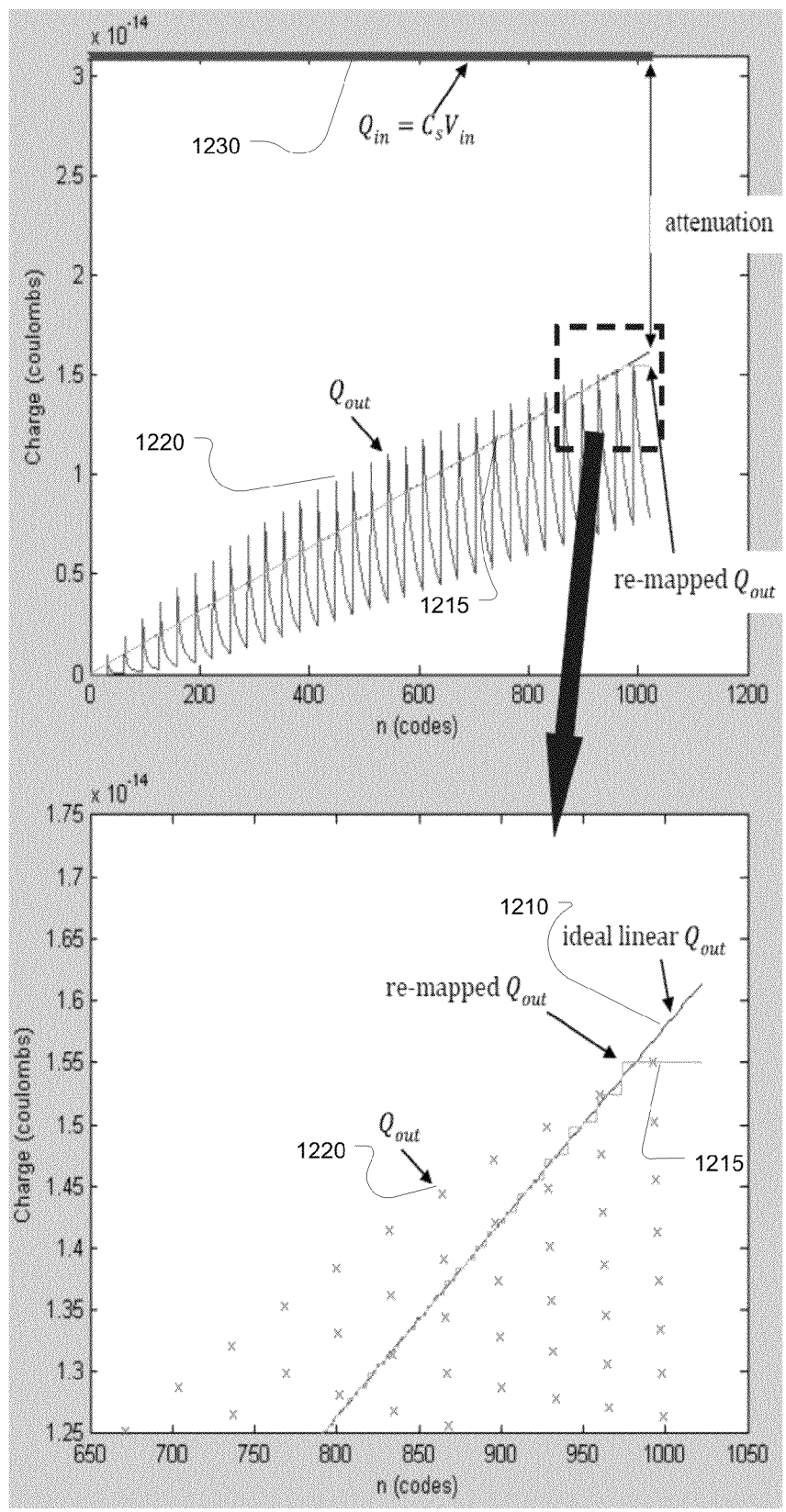
FIG. 17 is a graph of showing stored charge as a function input and mapped control values for a fixed input signal.

Referring to FIG. 17, charge transfer curves for a circuit as shown in FIG. 15 are illustrated in a form comparable to FIGS. 6 and 9. In the zoomed-in portion in the lower panel of the figure, each "x" marker along the charge output curve 1220 represents a charge quantity that the circuit is capable of creating, given a 1V input value. The curve 1215 represents the linearized curve using the optimal code remapping procedure.

Note more than two charge sharing phases can also be used in scaling a value. For example, turning back to FIG. 3A, in a first phase capacitor 205 may be charged to the input voltage, in a second phase a portion of that charge transferred to capacitor 220, in a third phase capacitor 205 discharged (not that the discharge paths for the capacitor are not shown in FIG. 3A), and in a fourth phase capacitor 205 charged by sharing the charge with capacitor 220. Yet other sequence of charge sharing using more than two cycles are possible with the configuration shown in FIG. 3A.

8 Applications

As is described above, charge sharing configurations can be used to implement digital signal processing algorithms using passive scaling circuits. A very wide range of applications can make use of such circuits. The following sections describe a relatively small number of exemplary applications which can benefit from the low power consumption, low cost, and low footprint provided by implementing digital signal processing algorithms using passive scaling circuits.

8.1 Time or Frequency Domain Filters

As is described in previous sections, the passive scaling circuits based on charge sharing techniques described herein can be used to implement time and frequency domain digital filter designs. Such implementations can provide low power and filtering with a small footprint in signal processing applications such as hearing aids or the front ends of analog to digital converters (ADCs). For example, filters using charge sharing can be used as anti-alias filters to prevent aliasing in acquired signals, notch filters which can remove unwanted signal components such as line frequency hum (e.g., 60 Hz hum). In other examples, high-pass filters using charge sharing techniques can be used to eliminate baseline wander (i.e., DC offset) in signals before they are digitized.

Furthermore, charge sharing techniques can be used to implement any arbitrary filter design for any signal processing application. The examples above are only a subset of the possible filter types which may be designed using charge sharing techniques.

8.2 Standalone Configurable Filter Package

In many modern systems (e.g., hearing aids), the use of configurable digital filter designs often requires costly and power intensive hardware such as dedicated digital signal processing hardware. In some examples, the approaches described above can be used to implement a configurable digital filter design on a self-contained device such as an integrated circuit. Use of such an integrated circuit could allow system designers to save cost and limit power consumption by avoiding the need to use digital signal processing hardware.

Figure 29B:
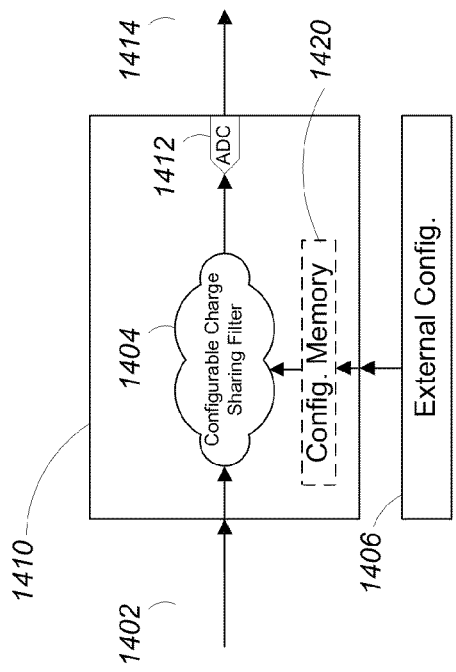
FIGS. 29a-d are examples of standalone configurable filter packages.
Figure 29D:
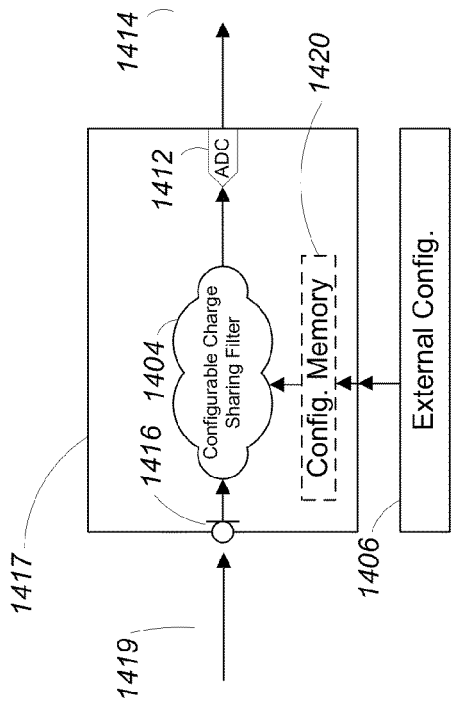
Figure 29A:
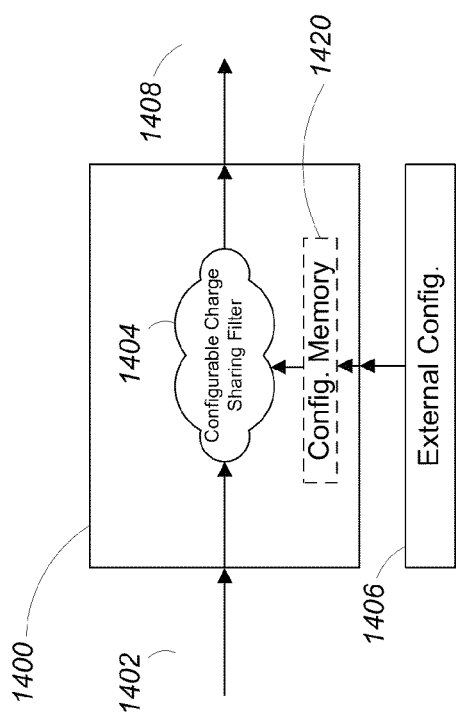

Referring to FIG. 29a, one example of such a circuit 1400 accepts an analog signal 1402 as input, applies a filter 1404 to the analog signal according to filter coefficients which are configurable by a module 1406 outside of the circuit 1400, and outputs a filtered analog signal 1408. For example, this type of filter could be incorporated into a hearing aid device where the mapping of the desired filter coefficients to configuration values may be performed in a software-based configuration program, and the values downloaded to the device.

Referring to FIG. 29b, another example of such a circuit 1410 accepts an analog signal 1402 as input, applies a filter 1404 to the analog signal according to filter coefficients which are configurable by a module 1406 outside of the circuit 1410 and digitizes the filtered analog signal using an analog to digital converter 1412. The output of the circuit 1410 is a filtered digital version of the input 1414.

Figure 29C:
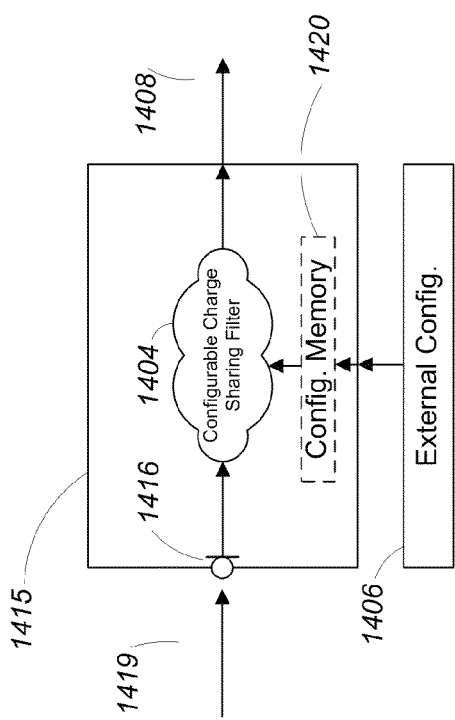

Referring to FIG. 29c, another example of such a circuit 1415 is integrated with a sensor 1416 such as a measurement microphone configured to transduce an analog signal 1419, such as a sound signal. The filter coefficients are configured (e.g., by a technician) such that the filter 1404 conditions an analog signal output by the sensor 1416, imparting a desired transfer function to the sensor 1416 (e.g., a linear frequency response). The filtered sensor signal is can be output as an analog signal 1408 or, as is shown in FIG. 29d, can be digitized using an analog to digital converter 1412.

In some examples, a modular platform can accept the configurable filter circuit as a module, along with, for example, a sensor module and an analog to digital converter module. For example, the modules may be seated on a flexible plastic platform an interconnected by flexible metal leads embedded in the plastic platform. The flexible plastic platform, including the modules, can be deformed to fit into non-standard housings.

In the above examples, the analog to digital converter 1412 can be implemented using charge sharing analog processing techniques (as described above) and can be integrated with the filter 1404.

In some examples, the circuits of FIGS. 29a-d can include a non-volatile configuration memory 1420 which can be used to configure the filter 1404 upon application of power to the circuit. In other examples, the filter can be configured via a digital control bus.

In an example use case of a filter package, the filter is integrated with a sensor, for example, a microphone (e.g., a MEMS microphone), an accelerometer, light sensor, magnetic sensor etc. so as to signal process the output of the sensor. During a manufacturing stage, fabrication variation among different sensors is compensated for by setting the filter characteristics to normalize the response (e.g., frequency response, impulse response, etc.) of the sensor. In this way, the package can be provided effectively providing matched sensors which can be used in applications where multiple matched elements are needed. In some applications, such configurations may be set or readjusted in the field, for example, to account for external components or physical structures. For example, the in accelerometer example, orientation characteristics can be normalized by providing a coordinate transformation of multiple accelerometers within the accelerometer.

8.3 Biological Signal Acquisition

In some applications, digital filters implemented using passive scaling circuits of the types discussed above can be integrated into signal acquisition systems which acquire biological signals. Signal acquisition for biological signals, for instance ECG signals, can be particularly difficult due to factors including relatively low signal to noise level and presence of high amplitude and time varying artifacts.

Signal acquisition systems often perform signal processing of acquired sensor signals for purposes such as noise removal. In some examples, fixed analog filtering may be performed before the signal is digitized and passed to another component of the system in which the processed signals are displayed. There is a need to perform processing of ECG signals that allows for flexible removal of noise in an inexpensive and low power package.

This need is met by acquiring biological signals (e.g., ECG signals) in analog form and processing them in a discrete time analog circuit, for example, using techniques described above or in the applications incorporated by reference.

The processing of sensor signals in an ECG system may include any combination of discrete time analog filtering including: low-pass filtering, high-pass filtering, band-pass filtering, notch filtering, and anti-alias filtering. The processing may also include discrete time analog sample rate conversion.

The discrete time analog filters may have configurable parameters. For example, a controller may perform mapping of desired filter coefficients to the configuration values of a discrete time analog filter. For example, the cutoff frequency of a high-pass filter may be adjusted to adapt to a perturbation in the low frequency noise component caused by the movement of a patient. In another example, the notch filter could be automatically adjusted to null out any unwanted interference. The configuration of the parameters of the discrete time analog filters may be performed by analog circuitry or by a controlling processor such as a microcontroller or general purpose computer.

The processing of the ECG signal may include one or more gain stages. The gain stages can be disposed at any point before, after, or between the discrete time analog filters. The gain stages may be configurable. For example, the gain may be adjusted ensure that the processed signal fully utilizes the input voltage range of the ADC.

The ADC and the discrete time analog filter may be designed together. For example, the output capacitor or capacitors of the analog filter could be shared with the ADC (e.g., a successive approximation ADC). By using redundant capacitors with destructive reads, the need for active components could be reduced or eliminated. Additionally, designing the ADC and the discrete time analog filter together allows for optimization of the ADC for digitizing low level signals (e.g., ECG signals).

In some implementations, the processing could be extended to implement analog matrix operations on a set of ECG leads (i.e., inputs). For example, the potential differences between multiple leads and a reference lead could be compared. In other examples, three-dimensional vector dipole calculations may be performed prior to digitization. In some examples in which a large number of leads are used (e.g., in some fetal ECG applications), analog processing may include reduction of the number of signals, such as selection or preferential weightings to select the quietest set of leads.

Use of discrete time analog filters can eliminate the need to use DSP components by reducing the need for high sample rate, high resolution ADCs and digital filtering. The elimination of DSP components may reduce the power consumption of the ECG systems. The reduced power consumption may enable battery-powered operation and may reduce the size, complexity, or component costs of the ECG system. In some implementations, the discrete time analog filters and the ADC can easily be combined into a single package of one or more ECG systems.

An exemplary system that embodies at least some of the features outlined above is shown in FIG. 19. An integrated device implements a signal acquisition system 806 that accepts eight electro-cardiogram (ECG) signals and outputs a discrete time digitized output representation of the signals. The inputs (i.e., leads) 812 to the device are coupled to electrodes that are used to measure potentials at the skin surface of a subject 800. In some examples the leads 812 are connected directly to the system 806, while in other examples, an amplification stage is provided externally before the signals are passed in continuous time analog form to the device.

The system includes eight identical input sections and a controller 808 that provides control signals to the stages. Each input section includes a processing section 802 and a digital to analog conversion section 804.

Figure 20:
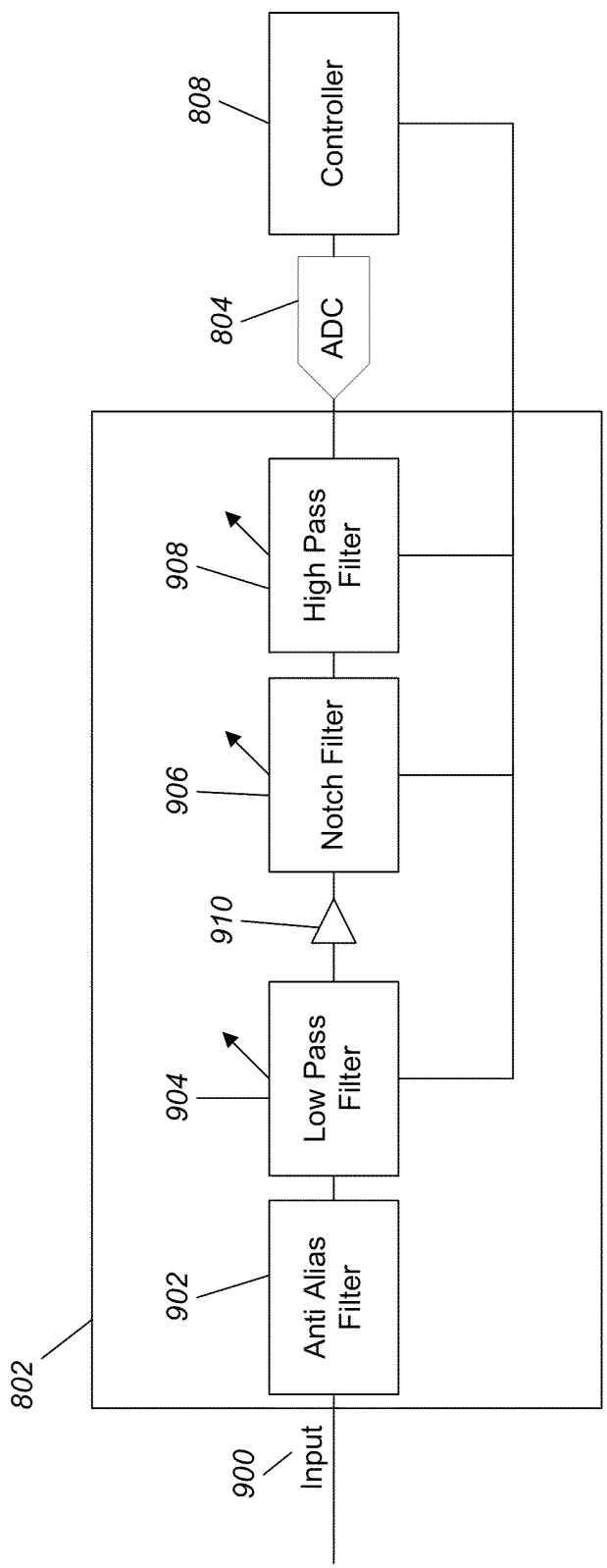
FIG. 20 is a block diagram of the signal processing path for one lead of an ECG system.

Referring to FIG. 20, each processing section 802 includes one or more discrete time analog processing sections in series, optionally coupled through gain elements 910 between the stages.

In one example, the first stage implements an anti-alias filter 902 in order to limit the bandwidth of the input signal 900 such that the Nyquist frequency corresponding to the sampling rate of the ADC 804 is greater than the bandwidth of the input signal. A second stage applies a low-pass filter 904 to remove any high frequency components that are not related to the ECG signal.

A third stage applies a notch filter 906 to the signal for the purpose of removing any unwanted interference (e.g., 50 Hz or 60 Hz line frequency) from the signal. A fourth stage applies a high-pass filter 908 to remove any DC or low frequency components from the signal.

In some examples, gain stages 910 are disposed at intermediate locations between the filter stages. The gain stages 910 generally amplify low level signals to ensure that the input voltage range of the ADC 804 is fully utilized.

The processing circuit 802 may operate at the same discrete time sampling rate as the ADC 804. More typically, the processing circuit 802 operates at a higher sampling rate than the ADC 804. The output of the processing circuit 802 can be updated at a rate that is lower than the sampling rate of the processing circuit 802, thereby decimating the output.

In some examples, the output of the processing circuit 802 can be accumulated over several sampling periods into an analog storage element (e.g., a capacitor), which is then used by the ADC 804. The ADC 804 and the processing circuit 802 can be designed together for the purpose of the sharing the analog storage element.

The controller 808 uses the outputs of the ADC to configure the processing components included in the processing circuit 802. The configuration of the components of the processing circuit 802 by the controller 808 may include non-linear feedback. For example, the high-pass filter could be adjusted, including adjustment of the cutoff frequency, and resetting of the filter when rapid changes (e.g., rapid onset artifacts) are sensed. In another example, the controller 808 can adjust the frequency, depth, and width of the notch filter. In another example, the controller 808 can be configured to adjust the gain in the system by controlling intermediate gain settings with multiple stages.

In some examples, the impulse response and/or frequency response is calculated using analog computation techniques. For example, harmonic analysis, implemented using an analog DFT, is performed on input signals 900, to identify periodicity that is used by the controller 808 to adjust filter parameters in the processing circuit 802.

In some examples, the processing stages include a joint stage in which computations such as weighted recombination of the signals is performed, for instance, to reduce the number of output signals or to derive a set of desired combinations.

Figure 21:
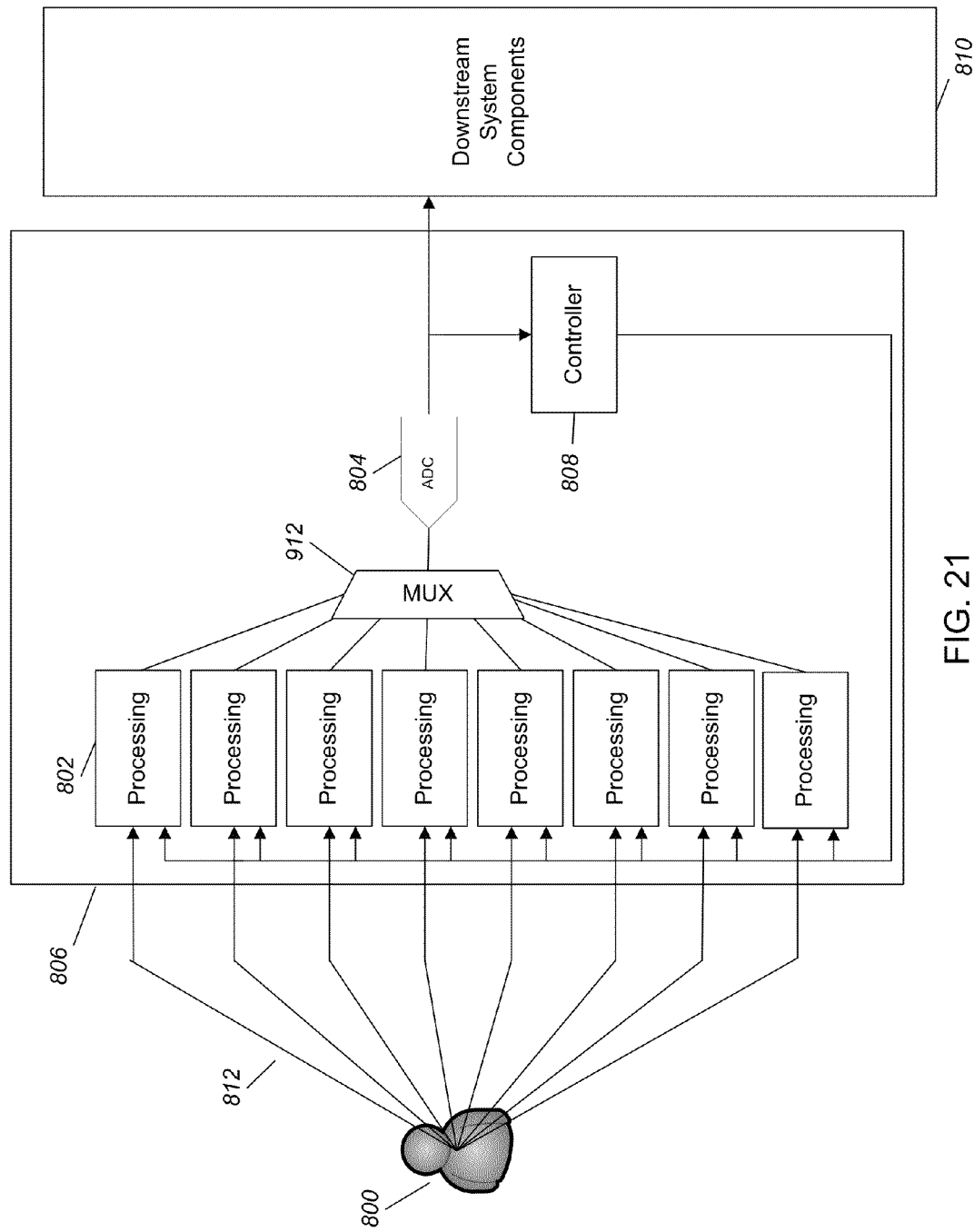
FIG. 21 is a block diagram of an ECG system configured to process and digitize eight leads that are connected to a patient. The digitization is accomplished using a multiplexer and a single ADC.

Another exemplary embodiment of an integrated signal acquisition system 806 is shown in FIG. 21. The system operates in much the same way as the system of FIG. 19 with the exception that the multiple ADCs 804 of FIG. 19 are replaced with a single ADC 804 and a multiplexer 912. The multiplexer 912 provides the ADC 804 with the output of each of the processing circuits 802 one after another. For example, in an eight lead system, each of the eight processing circuits 802 operates at a sampling rate of 10 kHz and the ADC 804 operates at a sampling rate of 80 kHz. The output of the processing circuits 802 are multiplexed into the ADC 804 by the multiplexer 912 one after another. The ADC 804 is configured to operate at eight times the sampling rate of each of the processing circuits 802 to ensure that the outputs of all of the processing circuits 802 are digitized.

8.4 Hearing Aids

As discussed above, one application of the approached described above is for forming filters that achieve desired frequency response characteristics. For example, a low power audio processing device (e.g., a hearing aid), may be configured to provide a desired response that is fitted to a particular person. In such a case, the mapping of the desired filter coefficients to the configuration values may be performed in a software-based configuration program, and the values downloaded to the device. For example, the software can include instructions stored on a disk of a configuration workstation that are executed on the workstation to determine the configuration values. The configuration values are then downloaded from the workstation to the device, for example, using a wired or wireless communication link, or stored in a storage device (e.g., electrically programmable memory device) that is transferred to the audio processing device.

In some examples, the filter coefficient values are determined in an adaptive filtering approach. For example, the coefficients are adjusted in an ongoing manner to minimize a signal energy. For example, cancellation of a feedback signal may be achieved by adjusting the coefficient values. In some such examples, the mapping characteristics are embedded in the device to allow incremental changes in coefficient values during the adaptation procedure.

In some examples, charge sharing analog filtering techniques can be used to eliminate unwanted noise in hearing aids by performing signal processing of acquired signals for the purpose of beam forming. For example, a hearing aid (or set of hearing aids) including two or more microphones may process the microphone signals using the charge sharing techniques described above to amplify signals emanating from a desired direction while attenuating ambient signals.

Figure 22:
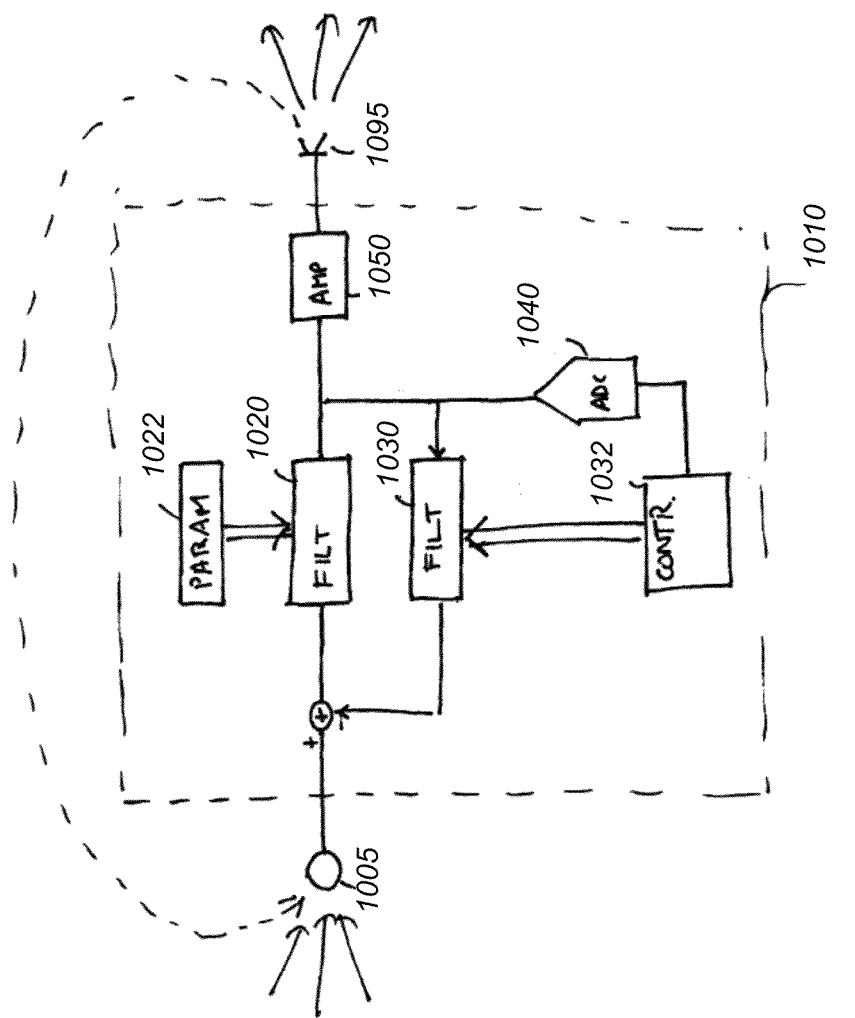
FIGS. 22 and 23 are block diagrams of configurable analog charge sharing filters in hearing aid systems.

Referring to FIG. 22, an example of a hearing aid system has a microphone 1005 that provides an input signal to an integrated hearing aid device 1010. The device provides an output to a transducer 1095, typically placed in the ear canal of the user. Due to the physical configuration of the system, there is typically an acoustic path that leaks energy from the transducer 1095 back to the microphone 1005.

The microphone 1005 provides an input signal that is passed to a first filter 1020. This filter is provisioned according to the desired frequency response characteristics for the user, for example, as determined by the user's health care provider and loaded into the device. In some examples, the filter is implemented using a discrete time analog signal processing approach as referred to above. Note that in some alternative embodiments, this forward filter may itself be configurable, for example, to implement features such as automatic gain control and amplitude compression.

An amplifier 1050 passes the processed signal to the transducer 1095. Note that minimal delay is introduced in the forward path from the microphone to the transducer, for example, based on the phase delay of the forward filter 1020 that is implemented.

Figure 23:
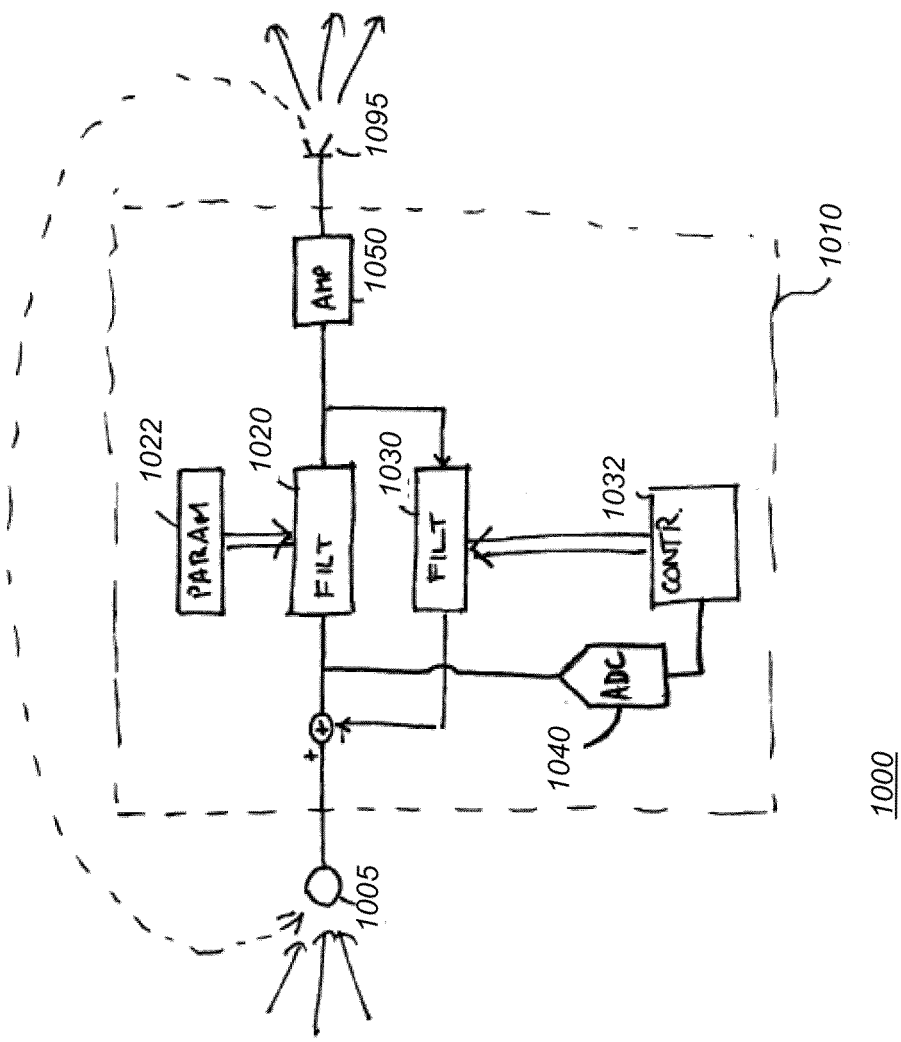

In some implementations, the output of the forward filter 1020 is passed to an analog to digital converter 1040, which provides a digital signal to a controller 1032. In other implementations, the output of a feedback filter 1030 is subtracted from the microphone 1050 input and the result is passed to the analog to digital converter 1040, which provides the digital signal to a controller 1032 (as is shown in FIG. 23).

In some implementations, the controller 1032 implements an adaptive algorithm to control parameters of the feedback filter 1030 and/or (not shown) parameters of the forward filter 1020. In some examples, the controller implements an adaptive cancellation algorithm so that the characteristics of the feedback filter track the characteristics of the acoustic feedback path, thereby mitigating feedback-based distortion of the signal.

Although described in the context of hearing aids that provide audio stimulation of the user's auditory system, one should recognize that very similar configurations may be used for processing input for neural stimulation, for example, in a cochlear implant based system.

8.5 Ultrasound Imaging

A number of implementations of an ultrasound imaging approach using approaches described above are described in detail in co-pending application PCT/US11/41625, titled "ULTRASOUND IMAGING WITH ANALOG PROCESSING."

One application of the approaches described above is in imaging systems. For instance medical ultrasound imaging systems often perform signal processing of acquired signals for purposes such as beam forming. In some examples, initial processing may be performed in a probe in which sensor signals are digitized and then processed using digital signal processing techniques before being passed to another component of the system in which images are formed from the processed signals.

In a ultrasound system in which the transducers in a probe form an array, one approach to sending excitation ultrasound signals and reconstructing images of tissue within the body from received ultrasound signals is to transmit excitation signals for each of the transducers from a main processing unit to the probe and then to transmit the received signals from the transducers back to the main processing unit. In some examples, each transducer has a separate electrical conductor for passing a signal to and/or from the main unit. In some examples, various forms of multiplexing or modulation are used to reduce the number of conductors required to pass the signals between the main unit and the probe. Processing the signals includes introducing desired delays on signals associated with different transducers to focus the delivery of transmitted ultrasonic signals or to focus the reception of signals on selected locations within the body.

In some ultrasound systems, some degree of processing is performed in the probe, thereby reducing the number of conductors needed for communication between the probe and a main unit or to reduce the amount of information passed between the probe and the mail unit. One form of processing is to introduce delays for input or output signals for different transducers to vary the focus of signals within the body. In some examples, a memory and a clocked system is used to sample signal to introduce delays that are an integral number of sampling periods by storing input or output values in the memory and retrieving them at the desired delay. In some examples, delay is introduced using a configurable analog phase delay element. In some examples, the desired delays have a time resolution less than the sampling time of the system. In such examples, fractional sample delays are accomplished by interpolating the signals associated with different transducers before delaying the signals. The delayed signal can then be re-sampled before transmission by a transducer. In some examples, subsets of transducers form "microarrays" and suitably delayed received signals are added together to form a combined signal such that each microarray has a single conductor or channel linking the probe and the main unit.

There is a need to perform more processing of the transmitted and/or received signals in an ultrasound probe in order to reduce the communication requirements between the probe and a main unit, or to completely eliminate the main unit entirely to form a portable imaging system, for example, with an integrated display.

There is also a need to perform processing using reduced power in a wireless probe, thereby permitting longer operating duration between battery charges or to reduce the power delivery requirements from a main unit to the probe or to reduce the power dissipation requirements of the probe. Also, in a two part system with a probe and a main unit, there is a need to reduce the amount of information passing from the probe to the main unit, thereby reducing the bandwidth requirement (e.g., over a wireless link) and/or transmission power requirement of the probe.

Figure 24:
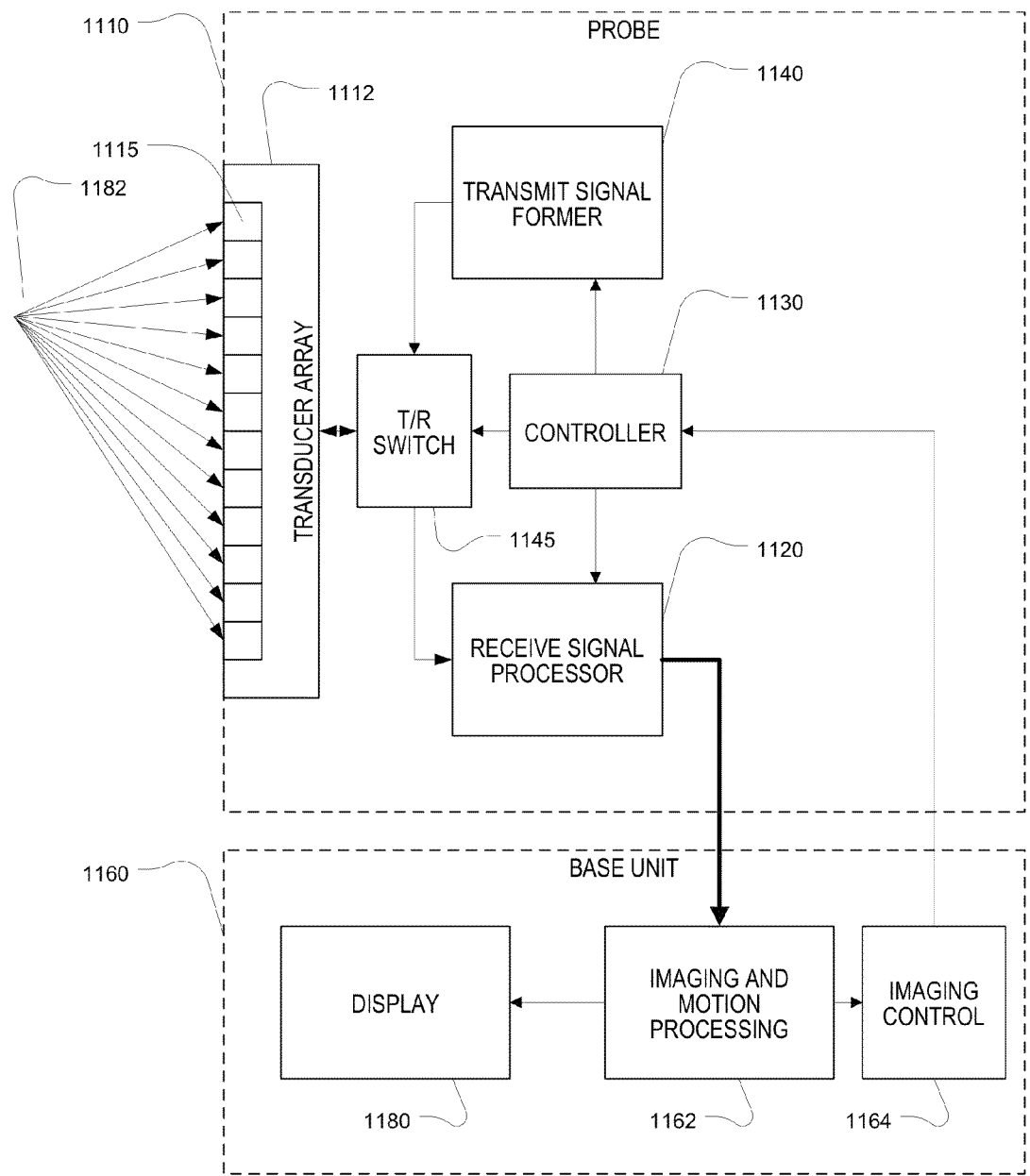
FIG. 24 is a block diagram of an ultrasound imaging system.

Referring to FIG. 24, an example of an ultrasound system 1100 includes a probe 1110 and a base unit 1160 coupled to the probe via a communication link. In other examples, the system is portable, and some or all of the elements of the base unit are hosted within the probe itself.

The ultrasound system makes use of an array 1112 with a set of ultrasonic elements 1115, for example 256 or 1024 or more arranged in a linear or grid pattern. These elements are used to emit and sense ultrasonic signals. These emitted signals are reflected within the patient's body and the reflected signals are sensed at the ultrasonic elements. A transmit signal former 1140 generates the signals for transmission from the elements, and a receive signal processor 1120 processes the sensed signals. A transmit/receive switch circuit 1145 is used to alternate between transmission and receiving phases of operation.

In some embodiments of the system, a beam forming approach is used in which the ultrasonic signals emitted from the elements are formed to create a focused signal at one or more desired locations within the body being sensed. Similarly, the signals received at the ultrasonic elements are processed in order to selectively acquire reflections originating at desired locations within the body.

Generally, the receive signal processor 1120 performs some or all of its processing in an analog domain prior to performing analog-to-digital conversion (ADC) of the received signals at the probe or base unit. In some examples, some of this analog processing is performed prior to amplification and reduces the performance requirements of such amplifiers. Various embodiments of the system may perform one or more of the following analog domain signal processing steps prior to digitization:

Time delay
  Anti-alias filtering
  Matched filtering (e.g., for processing of coded excitation signals)
  Gain control
  Transform (e.g., Fourier, compressing sensing) analysis
  Matrix operations Similarly, the formation of the excitation signals in the transmit signal former 1140 may make use of analog processing techniques, for example, to introduce delays suitable for focusing the emitted signals on desired parts of the body.

Generally, the processing performed by the receive signal processor 1120 and/or the transmit signal former 1140 varies as an image is acquired, for example, to perform a scanning operation in which a focus of the emitted signals is scanned through a three-dimensional body volume and the acquired signal is similarly focused to different locations in the body volume. A controller 1130 sends control signals to the processor 1120 and former 1140. For example, control signal may encode desired delays to introduce in the various output or input signal paths, or may provide more specific processing characteristics, for example, parameters of filters.

In some embodiments, the analog processing implemented in the transmit signal former 1140 and/or the receive signal processor 1120 make use of discrete time analog domain processing in which capacitors are coupled by controlled switches in order to accomplish desired signal processing functions by successive transfers of charge between the capacitors. A number of signal processing techniques using such charge sharing approaches are described in one or more of the following applications:

8.6 System Linearization

In some applications, the approaches described above can be used to linearize devices with non-linear frequency responses. System components, such as power amplifiers or electric motors, receive control or drive signals and produce outputs according to those signals. For instance, a power amplifier receives a low-power drive signal and outputs a high-power signal. A motor receives drive signals, such as a multiple phase Alternating Current (AC) signal and produces a rotational mechanical output. One use of power amplifiers is in communications systems components, for instance cell phone towers, often utilize power amplifiers to increase the power of low power intermediate frequency (IF) or radio frequency (RF) signals. The amplified signal is generally used to drive the antenna of a transmitter.

In practice, power amplifiers are nonlinear devices with only a portion of their operating range behaving in a linear manner. Some typical nonlinearities associated with power amplifiers are compression and/or saturation. These nonlinearities can result in distortion in the output of the power amplifier. One common type of distortion is harmonic distortion. For example, a communication system can transmit data at a number of discrete frequencies, or channels. Power amplifier distortion can result in unwanted harmonics located at frequencies between the channels.

Motors that are driven to produce a constant rotation speed may nevertheless have speed variation within each rotation, for example, due to mechanical factors such as worn bearings, load characteristics, and variations in the electromagnetic components of the motor.

Signal processing techniques exist to linearize the behavior of power amplifiers by detecting the distortion in the amplifier output and correcting it. In some examples, the frequency-dependent gain characteristics of the amplifier can be adaptively modified based on a comparison of the output level to the input level at different frequencies. In other examples, a model of the amplifier nonlinearity can be adaptively determined and the input signal to the power amplifier can be pre-distorted based on the determined nonlinearity. In another example, internal parameters of an amplifier, such as intermediate gain settings, can be adaptively modified.

Typically, existing system linearization is accomplished by using relatively simple analog circuits or using relatively expensive, power intensive digital components such as Digital Signal Processors (DSPs). There is a need to perform the signal processing of amplifier linearization in a low power and inexpensive manner while providing relatively complex forms of linearization.

An approach to linearization of a system, for instance a power amplifier or a motor, makes use of analog signal processing to linearize amplifier behavior. For instance, the output of an amplifier is acquired in analog form and processed in a discrete time analog circuit, for example, using techniques described above.

Nonlinearities associated with power amplifiers generally result in harmonically distorted output signals. The nonlinearities can be corrected by detecting the harmonic distortion in the output signals and adjusting parameters of the input signal to the system or the system itself to reduce or eliminate the harmonic distortion.

One method of power amplifier linearization may include performing an analog Discrete Fourier Transform (DFT) on the output signals of a system. The results of the DFT calculations are used to determine the degree of distortion imparted by the power amplifier.

Providing a power amplifier with one or more adjustable parameters, the method employs an adaptive algorithm such as a gradient scheme to reduce the amount of distortion at the output of the amplifier. The gradient scheme could be, for example, gradient estimation or partial derivative estimation. In these schemes, the gradient of the error is estimated and the adjustable parameters of the power amplifier are adjusted to reduce the amount of estimated error.

The adjustable parameters of the amplifier could include, for example, a plurality of selectable gain stages. The parameter adjustment could include selecting certain gain stages and bypassing other gain stages based on the adaptive parameter adjustment algorithm. In a simple case, the gain in the IF and RF stages could be adjusted independently.

Another method for linearizing a power amplifier involves correcting invertible nonlinearities by pre-distorting the input to the power amplifier. One approach for determining a desired pre-distortion involves taking an analog DFT of the output signals of the power amplifier in the case that the spectrum of the input signal is known or has known characteristics, such as that the input is periodic or has a narrow bandwidth such as in the case of a modulated carrier. Another approach uses results of two DFTs, one on the input signal and one on the output signal, which are then used together to determine the distortion imparted to the output signal by the power amplifier. An algorithm such as a gradient scheme is used to adaptively reduce the distortion by adjusting coefficients (e.g., of a polynomial) pre-distorter. The pre-distortion is applied to the input signal before providing the input signal to the amplifier. The net result of amplifying the pre-distorted signal using the power amplifier is a linear output signal.

While a typical application of linearization of nonlinear systems is power amplifiers, the above described methods are not limited to power amplifiers. Other nonlinear systems such as motors, for example, could benefit from the above methods. When providing a steady drive signal to a motor, it is expected that an even velocity will result. However, it is possible for periodic problems to arise, causing unwanted motor vibration. The methods above can be used to identify periodic problems and adjust parameters to compensate for it.

In applications such as motor linearization, sensors of physical quantities and analog analysis circuitry can be combined into one integrated package. For example, an integrated circuit including an accelerometer and an analog DFT can be disposed on a motor enclosure for the purpose of sensing vibration. The integrated circuit provides output, for example, represent the measured fundamental frequency, the fundamental level, and the level of the measured harmonics.

In another example, an integrated circuit including a current sensor and analog analysis could be configured to sense the current driving a motor. Characteristics of the measured current such as the spectrum could be tracked and some action could be taken when the measured characteristics diverge from the expected characteristics. For instance, an alert could be issued or analog logic could be used to implement an automatic control system to modify the driving signal. Another application is in failure detection, for example, in which a change in spectral characteristics measured in the device is used to signal possible failures.

Any type of sensor could be used (e.g., voltage, current, etc.) and any type of analysis could be performed (e.g., DFT, wavelet, etc.). Additionally, multiple sensors and multiple types of analysis could be included in the same integrated circuit.

Linearization of power amplifiers can make systems including power amplifiers more efficient. By reducing distortion at the amplifier output less signal processing, such as filtering out unwanted frequencies, is necessary. Performing the signal processing routines in analog circuitry can increase power efficiency compared to systems that perform the signal processing in digital circuitry such as a DSP component.

Power Amplifier Linearization by Adaptation of System Parameters

Figure 25:
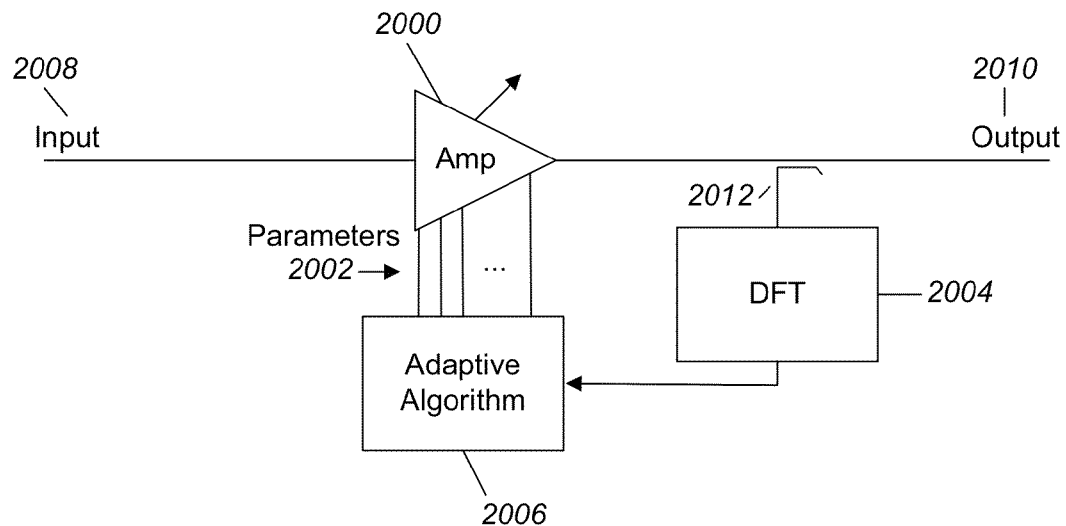
FIG. 25 is a block diagram of a system configured to linearize the output of a power amplifier by adaptively adjusting parameters of the power amplifier.

Referring to FIG. 25, a power amplifier 2000 includes a set of adjustable system parameters 2002. The parameters 2002 represent, for example, gain settings at different intermediate gain stages or frequency dependent gain settings.

After the input signal 2008 is amplified by the power amplifier 2000, the output signal 2010 is acquired by a directional coupler 2012 and sent to a DFT module 2014. The DFT 2014 of the output signal 2010 is calculated. An adaptive algorithm 2006 analyzes the DFT 2014 output to determine the extent of distortion present (e.g., harmonic distortion). Based on the determined distortion present in output signal 2010, the adaptive algorithm 2006 adjusts the parameters 2002 of the power amplifier 2000 in order to reduce the distortion in the output signal 2010, thereby linearizing the output of the power amplifier 2000.

In this embodiment, the DFT 2014 is implemented using the charge sharing techniques that are described in U.S. Pat. Pub 2010/0207644A1, "ANALOG COMPUTATION."

Power Amplifier Linearization by Time Domain Input Pre-Distortion

Figure 26:
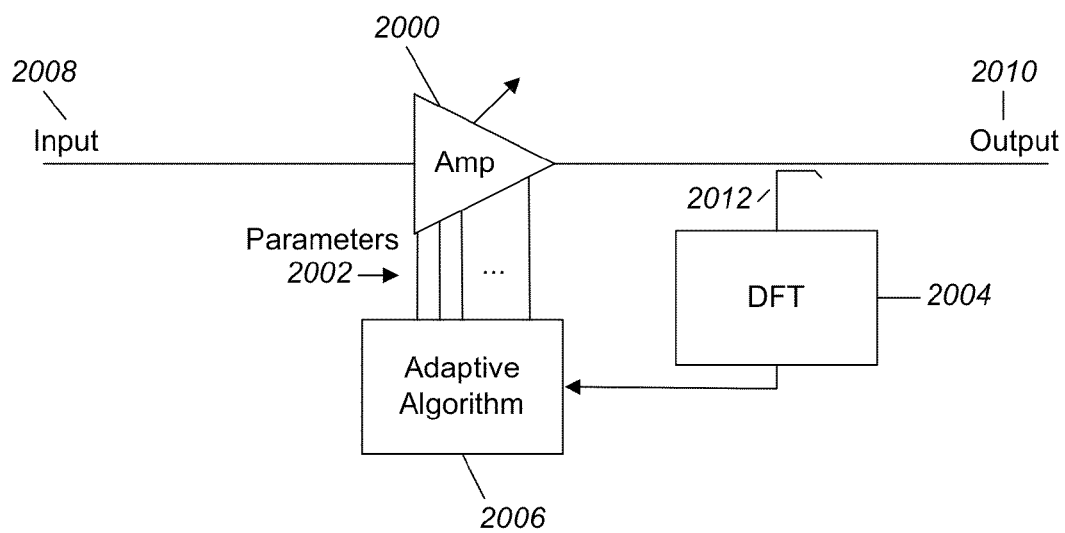
FIG. 26 is a block diagram of a system configured to linearize the output of a power amplifier by adaptively pre-distorting the time domain input to the power amplifier.

Referring to FIG. 26, a pre-distorter 2100 includes programmable coefficients that in this example represent the coefficients of a polynomial formed from the input sample (or a series of input samples if the pre-distortion has memory). The polynomial is used to apply distortion to a time domain input signal 2108 before it is applied to the input of a power amplifier 2102.

After the input signal 2108 is amplified by the power amplifier 2102, the output signal 210 is acquired by a directional coupler 2012 and sent to a DFT module 2104. The DFT 2104 of the output signal 210 is calculated. An adaptive algorithm 2106 analyzes the DFT 2104 output to determine the extent of distortion present (e.g., harmonic distortion). Based on the determined distortion present in the output signal 2110, the adaptive algorithm 2106 adjusts the polynomial coefficients in the pre-distorter 2100.

The purpose of adaptively pre-distorting the time domain input signal 2108 is to counteract the distortion imparted by the nonlinear behavior of the power amplifier 2102, thereby causing the output of the power amplifier 2102 to be linear.

In this embodiment, applying the programmable coefficients of the pre-distorter 2100 to the time domain input signal 2108 use the charge sharing techniques that are described above.

Power Amplifier Linearization by Frequency Domain Pre-Distortion

Figure 27:
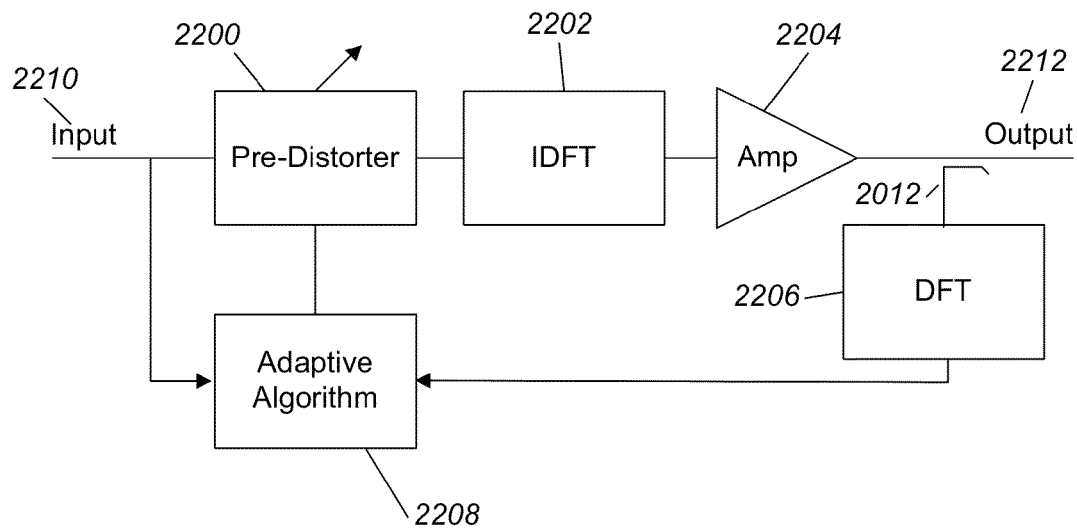
FIG. 27 is a block diagram of a system configured to linearize the output of a power amplifier by adaptively pre-distorting the frequency domain input to the power amplifier.

Referring to FIG. 27, a system for power amplifier linearization by frequency domain pre-distortion is presented in the context of an Orthogonal Frequency Division Multiplexing (OFDM) communication scheme. The system includes a pre-distorter 2200 that includes programmable coefficients used to weight a frequency domain input signal 2210 (e.g., an OFDM symbol). An inverse Fourier transform (IDFT) 2202 is disposed in the forward path of the system and converts the pre-distorted frequency domain signal into the time domain so it can be amplified by the power amplifier 2204, which exhibits nonlinear characteristics.

After the time domain signal is amplified, creating the output signal 2212, the output signal 2212 is acquired by a directional coupler 2012 and sent to a DFT module 2206. The DFT 2206 of the output signal 2212 is calculated. The result of the DFT 2206 calculation and the frequency domain input signal 2210 are both used by the adaptive algorithm 2208 to determine the distortion (e.g., harmonic distortion) imparted to the output signal 2212 by the power amplifier 2204. The determined distortion is used by the adaptive algorithm 308 to adjust the set of programmable coefficients in the pre-distorter 2200, thereby linearizing the power amplifier 2204.

In this embodiment the IDFT 2202, the DFT 2206, and the Pre-Distorter 2200 use the charge sharing techniques that are described in U.S. Pat. Pub 2010/0207644A1, "ANALOG COMPUTATION."

Harmonic and Torque Ripple Minimization

Figure 28:
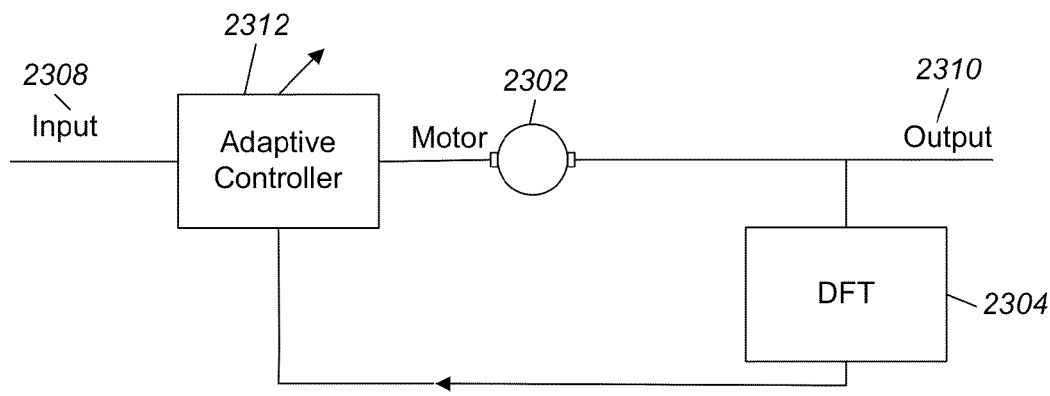
FIG. 28 is a block diagram of a system configured to linearize the output of a motor by adaptively pre-distorting the driving input to the motor.

Referring to FIG. 28, in another embodiment, a three phase motor 2302 is configured to be driven at a constant rotation speed by an input signal 2308. A DFT module 2304 accepts a signal directly or indirectly measuring the rotation of the motor (e.g., a tachometer, or in some embodiments, a sensing of the driving current). An adaptive three-phase controller 2312 accepts the output of the DFT 2304 and determines the extent of the distortion present (e.g., harmonic magnitudes and phases) in the rotational speed. The controller adjusts the AC input signals timing and magnitude to minimize harmonic distortion, thereby regulating the rotational speed of the motor 2302.

In another embodiment, a DC motor 2302 is configured to be driven at a constant rotation speed by an input signal 2308. An adaptive controller 2312 accepts the output of the DFT 2304 and identifies the distortion present (e.g., harmonic magnitudes and phases) in the rotational speed.

The controller 2312 varies the DC level driving the motor 2302 in a periodic manner, thereby regulating the rotational speed of the motor 2302.

In some embodiments the DFT 2304 and/or the Adaptive Controller 2312 use the charge sharing techniques that are described in U.S. Pat. Pub 2010/0207644A1 "ANALOG COMPUTATION."

8.7 Analog-to-Digital Conversion

In some applications, passive scaling circuits of the types discussed above are integrated into a Analog-to-Digital Converter (ADC). For instance, in FIG. 3B, the capacitor 205 may be integral to an ADC, for example, providing analog value storage during operation of a successive approximation converter. In other examples, the charge stored on the capacitor is the quantity that is converted using a charge transfer approach. In some such approaches, the capacitor 205 is implemented as an array of switchable capacitors which are used in a successive approximation charge transfer based ADC. In yet other examples of ADC approaches, the passive scaling approached described above are used to scale a reference voltage for comparison with an input voltage, which may be presented on an capacitor that is at the output of a charge sharing based passive filter. One implementation of such an ADC uses successive scalings of a reference voltage using the scaling circuits described above in a successive approximation approach, with the scaled reference voltages being passed to a comparator with the voltage being converted, with the output of the converter being used to determine the output and control the successive scalings of the reference voltage.

9 Implementations

In some examples, the signals being processed are audio signals. In other examples, other frequency ranges, such as radio frequency signals are processed according to the approaches described above.

In some implementations, circuits of the types described above are fabricated in an integrated circuit. The capacitors may be formed from various circuit structures, for example but not limited to metal layers, polysilicon layers, MOS transistors (which in some examples can have controllable capacitance according to a settable bias), diodes, etc. In some examples, multiple stages of charge sharing are cascaded, without necessarily requiring active (e.g., amplification) stages between them. In some examples, other analog processing components are integrated onto the same device, for example, to provide a Discrete Fourier Transform (DFT) processor in addition to a Finite Impulse Response filter.

In some implementations, the signal scaling approached described above are used to scale the inputs and/or the outputs of a DFT processor, for instance to implement a windowed Fourier Transform, or to implement scaling of frequency components in a frequency domain filter.

In some examples, an automated procedure is used to select the particular parameter values, such as the number of bits to be used for each configurable capacitor. In some examples, the mapping process is performed on the device, for example, using a hardware mapping table, while in other examples, the mapping is performed on a different device, such as on a processor that is used to configure the device.

In some examples for a filter implementation, different sections have different circuit arrangements. For example, the filter coefficients at different delays may have different typical ranges, and therefore, the circuit arrangements may be tailored to provide higher resolution in the typical value ranges than in other ranges.

In some examples, the approaches described above used to form a machine-readable representation of the circuits, which can then be used as an input to a process for fabrication of devices with the circuits, optionally combined in a modular manner with other circuit components.

It is to be understood that the foregoing description is intended to illustrate and not to limit the scope of the invention, which is defined by the scope of the appended claims. Other embodiments are within the scope of the following claims.

What is claimed is:

1. A method for mapping input values to capacitor values to implement a programmable discrete time analog filter, comprising:
accepting a plurality of filter coefficient input values;
determining a plurality of digital configuration values for a plurality of configurable capacitors in a programmable discrete time analog filter, wherein the plurality of digital configuration values are determined according to a non-linear mapping of the filter coefficient input values to the digital configuration values; and
providing the digital configuration values for configuration of the programmable filter.

2. The method of claim 1, further comprising providing a passive signal scaling circuit.

3. The method of claim 1, wherein the filter coefficient input values are floating point numbers and the non-linear mapping comprises mapping the floating point numbers to DAC values.

4. The method of claim 1, wherein each of the digital configuration values is for configuring capacitance of a capacitive element of the plurality of configurable capacitors.

5. The method of claim 1, wherein the programmable discrete time analog filter processes analog biological signals.

6. The method of claim 1, wherein the programmable discrete time analog filter processes one of analog hearing aid signals and analog ultrasound signals.

7. The method of claim 1, further comprising providing at least one charge sharing stage wherein at least a subset of the plurality of configurable capacitors share charges.

8. The method of claim 1, wherein the programmable filter is configured as one of a finite impulse response filter and an infinite impulse response filter.

9. The method of claim 1, wherein the programmable filter is one of a low-pass filter, a high-pass filter, a band-pass filter, a notch filter, and an anti-aliasing filter.

10. The method of claim 1, further comprising compressive sensing processing an analog input signal to generate a series of analog signal input values, and processing the analog signal input values using the programmable filter.

11. A method for mapping input values to capacitor values to implement a programmable discrete time analog filter, comprising:
   accepting a plurality of filter coefficient input values;
   determining a plurality of digital configuration values for a plurality of configurable capacitors in the programmable analog frequency domain filter, wherein the plurality of digital configuration values are determined according to a non-linear mapping of the filter coefficient input values; and
   providing the digital configuration values for configuration of the programmable filter.

12. The method of claim 11, further comprising determining an analog Discrete Fourier Transform of an input signal.

13. The method of claim 11, further comprising providing a passive signal scaling circuit.

14. The method of claim 11, wherein the filter coefficient input values are floating point numbers and the non-linear mapping comprises mapping the floating point numbers to DAC values.

15. The method of claim 11, wherein each of the digital configuration values is for configuring capacitance of a capacitive element of the plurality of configurable capacitors.

16. The method of claim 11, further comprising providing at least one charge sharing stage wherein at least a subset of the plurality of configurable capacitors share charges.

17. A programmable discrete time analog filter, comprising:
   an input for accepting a series of analog signal input values;
   a plurality of analog storage elements configurable to store the series of signal input values;
   a plurality of passive signal scaling circuits, each including a plurality of configurable capacitors, wherein each of the plurality of passive signal scaling circuits is configurable to accept one of the analog signal input values from one of the analog storage elements and store an analog representation of a scaled signal value; and
   means for accepting a plurality of filter coefficient input values and determining a plurality of digital configuration values for the plurality of configurable capacitors, wherein the plurality of digital configuration values are determined according to a non-linear mapping of the filter coefficient input value.

18. The programmable discrete time analog filter of claim 17, wherein the filter coefficient input values are floating point numbers and the non-linear mapping comprises mapping the floating point numbers to DAC values.

19. The programmable discrete time analog filter of claim 17, further comprising a passive combination circuit for forming an analog output signal value, wherein forming the analog output signal value includes combining the stored analog representation of the scaled signal value for a plurality of analog input signal values.

20. The programmable discrete time analog filter of claim 17, further comprising a processor for performing compressive sensing of an analog input signal to generate the series of analog signal input values.

* * * * *